(12) United States Patent
Ino et al.

(10) Patent No.: US 12,261,041 B2
(45) Date of Patent: Mar. 25, 2025

(54) SEMICONDUCTOR DEVICE MANUFACTURING METHOD, SEMICONDUCTOR MEMORY DEVICE MANUFACTURING METHOD, SEMICONDUCTOR MEMORY DEVICE, AND SUBSTRATE TREATMENT APPARATUS

(71) Applicant: Kioxia Corporation, Tokyo (JP)

(72) Inventors: Tsunehiro Ino, Fujisawa (JP); Akira Takashima, Fuchu (JP)

(73) Assignee: Kioxia Corporation, Tokyo (JP)

( * ) Notice: Subject to any disclaimer, the term of this patent is extended or adjusted under 35 U.S.C. 154(b) by 416 days.

(21) Appl. No.: 17/806,282

(22) Filed: Jun. 10, 2022

(65) Prior Publication Data

US 2023/0187203 A1 Jun. 15, 2023

(30) Foreign Application Priority Data

Dec. 14, 2021 (JP) ................. 2021-202915

(51) Int. Cl.
*H01L 21/02* (2006.01)
*C23C 16/30* (2006.01)
*C23C 16/40* (2006.01)
*H10B 43/27* (2023.01)

(52) U.S. Cl.
CPC ...... *H01L 21/02326* (2013.01); *C23C 16/303* (2013.01); *C23C 16/403* (2013.01); *H01L 21/02178* (2013.01); *H10B 43/27* (2023.02)

(58) Field of Classification Search
CPC ......... H01L 21/02326; H01L 21/02178; C23C 16/303; C23C 16/403
See application file for complete search history.

(56) References Cited

U.S. PATENT DOCUMENTS

| 4,019,914 A | * | 4/1977 | Esper | ...................... | C01F 7/442 423/625 |
| 4,676,928 A | * | 6/1987 | Leach | ...................... | C01F 7/021 423/625 |
| 5,000,113 A | | 3/1991 | Wang et al. | | |

(Continued)

FOREIGN PATENT DOCUMENTS

| JP | 63-246829 A | 10/1988 |
| JP | 02-102180 A | 4/1990 |

(Continued)

OTHER PUBLICATIONS

Shaghayegh Ghanizadeh, et al., "Synthesis of nano α-alumina powders using hydrothermal and precipitation routes: a comparative study" Ceramics International 40 (2014), 1311-1319, May 9, 2013.

*Primary Examiner* — Eugene Lee
(74) *Attorney, Agent, or Firm* — Oblon, McClelland, Maier & Neustadt, L.L.P.

(57) ABSTRACT

A semiconductor device manufacturing method of embodiments includes: forming an aluminum nitride film; forming an aluminum hydroxide film containing diaspore-type aluminum hydroxide by performing treatment in a fluid containing water to the aluminum nitride film; and forming an aluminum oxide film containing α-type aluminum oxide by performing heat treatment to the aluminum hydroxide film at a temperature equal to or more than 500° C. and equal to or less than 800° C.

20 Claims, 15 Drawing Sheets

(56) References Cited

U.S. PATENT DOCUMENTS

| | | | |
|---|---|---|---|
| 5,800,922 A * | 9/1998 | Anderson | C01F 7/02 423/625 |
| 6,162,413 A * | 12/2000 | Fujiwara | C01F 7/02 423/625 |
| 7,033,567 B2 * | 4/2006 | Uchida | C04B 35/6268 423/625 |
| 11,735,673 B2 * | 8/2023 | Noguchi | H01L 29/792 257/324 |
| 2006/0073093 A1 * | 4/2006 | Maki | C01F 7/308 423/625 |
| 2007/0021292 A1 * | 1/2007 | Maki | C01F 7/023 501/153 |
| 2008/0230393 A1 | 9/2008 | Okazaki et al. | |
| 2009/0071934 A1 | 3/2009 | Choi et al. | |
| 2009/0123363 A1 * | 5/2009 | Maruno | C01F 7/308 423/625 |
| 2009/0311874 A1 | 12/2009 | Tomita et al. | |
| 2010/0075055 A1 | 3/2010 | Suchanek | |
| 2010/0086770 A1 | 4/2010 | Roesch | |
| 2011/0230054 A1 | 9/2011 | Tomita et al. | |
| 2017/0008092 A1 | 1/2017 | Ruppi et al. | |
| 2017/0225434 A1 * | 8/2017 | Lee | B32B 15/20 |
| 2018/0137959 A1 | 5/2018 | Saigusa et al. | |
| 2019/0276612 A1 * | 9/2019 | Inaba | C08J 5/18 |
| 2019/0279932 A1 | 9/2019 | Wakatsuki et al. | |
| 2021/0257500 A1 | 8/2021 | Noguchi et al. | |
| 2022/0158029 A1 * | 5/2022 | Ohido | C30B 29/20 |
| 2023/0272222 A1 * | 8/2023 | Kurizoe | B32B 27/308 428/319.3 |

FOREIGN PATENT DOCUMENTS

| | | |
|---|---|---|
| JP | 08-192127 A | 7/1996 |
| JP | 2009-055030 A | 3/2009 |
| JP | 2009-132961 A | 6/2009 |
| JP | 2010-519068 A | 6/2010 |
| JP | 2011-192885 A | 9/2011 |
| JP | 2012-101978 A | 5/2012 |
| JP | 5566891 B2 | 8/2014 |
| JP | 5588597 B2 | 9/2014 |
| JP | 2015-135942 A | 7/2015 |
| JP | 2016-001753 A | 1/2016 |
| JP | 2016-066811 A | 4/2016 |
| JP | 2017-506163 A | 3/2017 |
| JP | 2018-082014 A | 5/2018 |
| JP | 2019-160918 A | 9/2019 |
| JP | 2021-129042 A | 9/2021 |

* cited by examiner

SEMICONDUCTOR DEVICE MANUFACTURING METHOD, SEMICONDUCTOR MEMORY DEVICE MANUFACTURING METHOD, SEMICONDUCTOR MEMORY DEVICE, AND SUBSTRATE TREATMENT APPARATUS

CROSS-REFERENCE TO RELATED APPLICATION

This application is based upon and claims the benefit of priority from Japanese Patent Application No. 2021-202915, filed on Dec. 14, 2021, the entire contents of which are incorporated herein by reference.

FIELD

Embodiments described herein relate generally to a semiconductor device manufacturing method, a semiconductor memory device manufacturing method, a semiconductor memory device, and a substrate treatment apparatus.

BACKGROUND

For example, a logic device includes a scaled-down metal oxide field effect transistor (MOSFET) in order to improve the performance of the device. The scaled-down MOSFET requires a gate insulating layer that is thin and has a small leakage current.

In addition, a three-dimensional NAND flash memory in which memory cells are three-dimensionally arranged realizes a high degree of integration and a low cost. In the three-dimensional NAND flash memory, for example, a memory hole penetrating a stacked body is formed in the stacked body in which a plurality of insulating layers and a plurality of gate electrode layers are alternately stacked. By forming a charge storage layer and a semiconductor layer in the memory hole, a memory string in which a plurality of memory cells are connected in series to each other is formed. Each memory cell has a block insulating layer for suppressing the escape of charge held in the charge storage layer to the gate electrode. For the scaling-down of memory cells, a block insulating layer that is thin and has a small leakage current is required.

DETAILED DESCRIPTION

Figure 1:
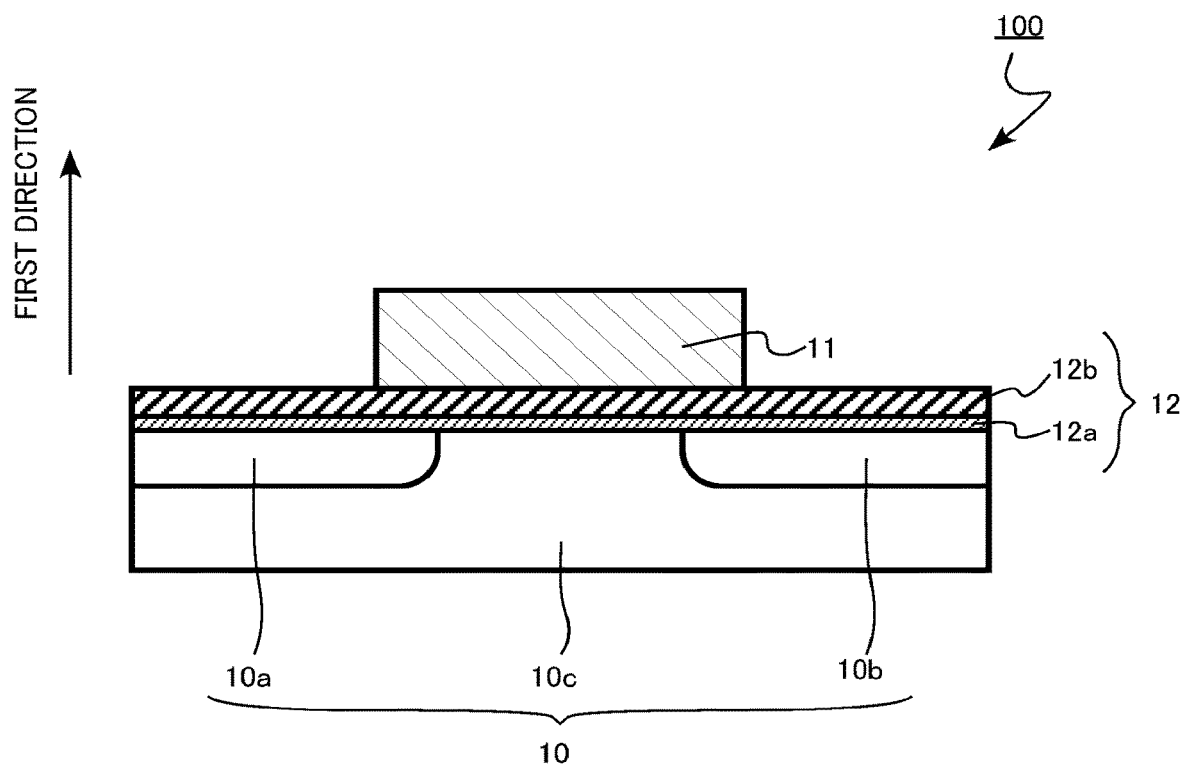
FIG. 1 is a schematic cross-sectional view of a semiconductor device according to a first embodiment.

A semiconductor device manufacturing method of embodiments includes: forming an aluminum nitride film; forming an aluminum hydroxide film containing diaspore-type aluminum hydroxide by performing treatment in a fluid containing water to the aluminum nitride film; and forming an aluminum oxide film containing α-type aluminum oxide by performing heat treatment to the aluminum hydroxide film at a temperature equal to or more than 500° C. and equal to or less than 800° C.

Hereinafter, embodiments will be described with reference to the accompanying diagram. In addition, in the following description, the same or similar members and the like are denoted by the same reference numerals, and the description of the members and the like once described will be omitted as appropriate.

The qualitative analysis and quantitative analysis of the chemical composition of members configuring the semiconductor device or the semiconductor memory device in this specification can be performed by, for example, secondary ion mass spectroscopy (SIMS), energy dispersive X-ray spectroscopy (EDX), electron energy loss spectroscopy (EELS), or X-ray photoelectron spectroscopy (XPS). In addition, when measuring the thickness of each member configuring the semiconductor device or the semiconductor memory device, a distance between members, and the like, for example, a transmission electron microscope (TEM) can be used. In addition, for the identification of the crystal system of the constituent substance of each member configuring the semiconductor device or the semiconductor memory device and the comparison of the abundance ratio of the crystal systems, for example, a transmission electron microscope, X-ray diffraction (XRD), electron beam diffraction (EBD), X-ray photoelectron spectroscopy, or synchrotron radiation X-ray absorption fine structure (XAFS) can be used.

First Embodiment

A semiconductor device manufacturing method according to a first embodiment includes: forming an aluminum nitride film; forming an aluminum hydroxide film containing diaspore-type aluminum hydroxide by performing treatment in a fluid containing water to the aluminum nitride film; and forming an aluminum oxide film containing α-type aluminum oxide by performing heat treatment to the aluminum hydroxide film at a temperature equal to or more than 500° C. and equal to or less than 800° C.

FIG. 1 is a schematic cross-sectional view of a semiconductor device according to the first embodiment. The semiconductor device according to the first embodiment is manufactured by using a semiconductor device manufacturing method according to the first embodiment. The semiconductor device according to the first embodiment is a MOSFET 100. The MOSFET 100 is a MOSFET having a planar gate structure.

The MOSFET 100 includes a semiconductor layer 10, a gate electrode layer 11, and a gate insulating layer 12. The semiconductor layer 10 includes a source region 10a, a drain region 10b, and a channel region 10c. The gate insulating layer 12 includes a lower layer 12a and an upper layer 12b.

The semiconductor layer 10 is a semiconductor. The semiconductor layer 10 is, for example, a single crystal. The semiconductor layer 10 is, for example, silicon. The semiconductor layer 10 is, for example, an oxide semiconductor.

The semiconductor layer 10 includes a source region 10a, a drain region 10b, and a channel region 10c. The channel region 10c is provided between the source region 10a and the drain region 10b.

The source region 10a and the drain region 10b are, for example, n-type semiconductors. In addition, the channel region 10c is, for example, a p-type semiconductor.

The gate electrode layer 11 is a conductor. The gate electrode layer 11 contains, for example, a metal, a metal semiconductor compound, or a semiconductor containing conductive impurities.

The upper layer 12b of the gate insulating layer 12 is provided between the semiconductor layer 10 and the gate electrode layer 11. The lower layer 12a of the gate insulating layer 12 is provided between the semiconductor layer 10 and the upper layer 12b.

The lower layer 12a is an insulating layer. The lower layer 12a contains, for example, silicon (Si) and oxygen (O). The lower layer 12a contains, for example, silicon oxide. The lower layer 12a is, for example, a silicon oxide layer.

The lower layer 12a has, for example, a function of reducing the interface state of the interface between the semiconductor layer 10 and the gate insulating layer 12.

The thickness of the lower layer 12a in a first direction from the semiconductor layer 10 toward the gate electrode layer 11 is, for example, equal to or more than 0.3 nm and equal to or less than 2 nm.

The upper layer 12b is an insulating layer. The upper layer 12b contains aluminum oxide. The upper layer 12b contains aluminum oxide as a main component. The fact that the upper layer 12b contains aluminum oxide as a main component means that the aluminum oxide has the highest mole fraction among the substances contained in the upper layer 12b. The upper layer 12b is, for example, an aluminum oxide layer.

The aluminum oxide contained in the upper layer 12b contains α-type aluminum oxide. The α-type aluminum oxide is also called α-alumina. The α-type aluminum oxide has a crystal structure of space group No. 167 R-3c. The α-type aluminum oxide is expressed as, for example, $Al_2O_3$ in the chemical formula.

The aluminum oxide contained in the upper layer 12b contains α-type aluminum oxide as a main component. The fact that the aluminum oxide contained in the upper layer 12b contains α-type aluminum oxide as a main component means that the α-type aluminum oxide has the highest mole fraction among the aluminum oxides contained in the upper layer 12b.

The upper layer 12b contains, for example, diaspore-type aluminum hydroxide. The diaspore-type aluminum hydroxide has a crystal structure of space group No. 62 Pbnm. The diaspore-type aluminum hydroxide is expressed as, for example, AlO(OH) or AlOOH in the chemical formula. Aluminum hydroxide having an AlO(OH) composition may be particularly referred to as aluminum hydroxide oxide to distinguish this from aluminum hydroxide having an $Al(OH)_3$ composition in a narrow sense. However, since most of the materials containing Al, O, and H in reality are a mixture of a material having an AlO(OH) composition, a material having an $Al(OH)_3$ composition, and a material having an $Al_2O_3$ composition, the name such as aluminum hydroxide in a broad sense is often used. The name such as aluminum hydroxide used in the present application also means aluminum hydroxide in a broad sense containing AlO(OH) and the like.

The upper layer 12b contains, for example, sulfur (S) or chlorine (Cl). The upper layer 12b contains, for example, nitrogen (N).

The thickness of the upper layer 12b in the first direction from the semiconductor layer 10 toward the gate electrode layer 11 is, for example, equal to or more than 0.5 nm and equal to or less than 2.5 nm.

FIGS. 2A to 2E are explanatory diagrams of the semiconductor device manufacturing method according to the first embodiment.

Figure 2A:
FIGS. 2A to 2E are explanatory diagrams of a semiconductor device manufacturing method according to the first embodiment.

First, a p-type single crystal silicon layer 50 is prepared. Then, a silicon oxide film 51 is formed on the single crystal silicon layer 50 (FIG. 2A).

The silicon oxide film 51 is formed, for example, by thermally oxidizing the surface of the single crystal silicon layer 50. The silicon oxide film 51 finally becomes the lower layer 12a. The thickness of the silicon oxide film 51 is, for example, equal to or more than 0.3 nm and equal to or less than 2 nm.

Figure 2B:
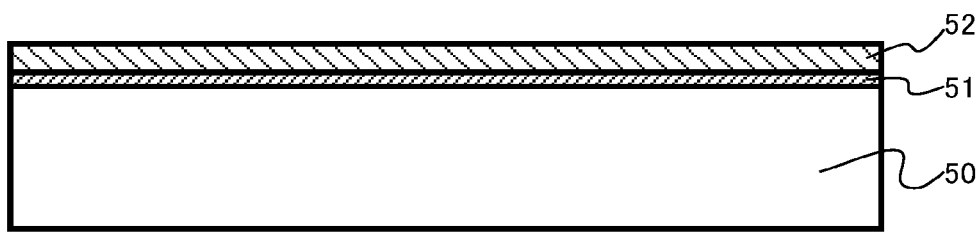

Then, an aluminum nitride film 52 is formed on the silicon oxide film 51 (FIG. 2B). The thickness of the aluminum nitride film 52 is, for example, equal to or more than 0.5 nm and equal to or less than 5 nm. The aluminum nitride film 52 is formed by using, for example, an atomic layer deposition (ALD) method.

Figure 2C:
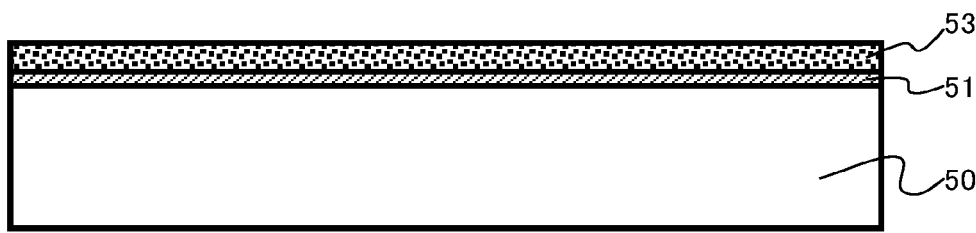

Then, a treatment in a fluid containing water is performed on the aluminum nitride film 52 to form an aluminum hydroxide film 53 (FIG. 2C). By the treatment in the fluid, the aluminum nitride film 52 is changed to the aluminum hydroxide film 53. The aluminum hydroxide film 53 contains diaspore-type aluminum hydroxide.

The main component of the fluid is water. The fact that a fluid contains water as a main component means that the mole fraction of water is the highest among the substances contained in the fluid. The fluid is, for example, pure water.

The fluid is, for example, acidic or alkaline. The fluid contains, for example, nitric acid, sulfuric acid, hydrochloric acid, or ammonia.

The treatment in the fluid is performed, for example, at a temperature equal to or more than 250° C. and equal to or less than 400° C. and a pressure equal to or more than 15 MPa and equal to or less than 100 MPa. During the treatment in the fluid, for example, the temperature is set to be equal to or more than 250° C. and the pressure is set to be equal to or more than 15 MPa within 30 minutes after the aluminum nitride film 52 comes into contact with the fluid.

The fluid may be, for example, a supercritical fluid or a subcritical fluid. The fluid may be, for example, supercritical water or subcritical water.

Figure 3:
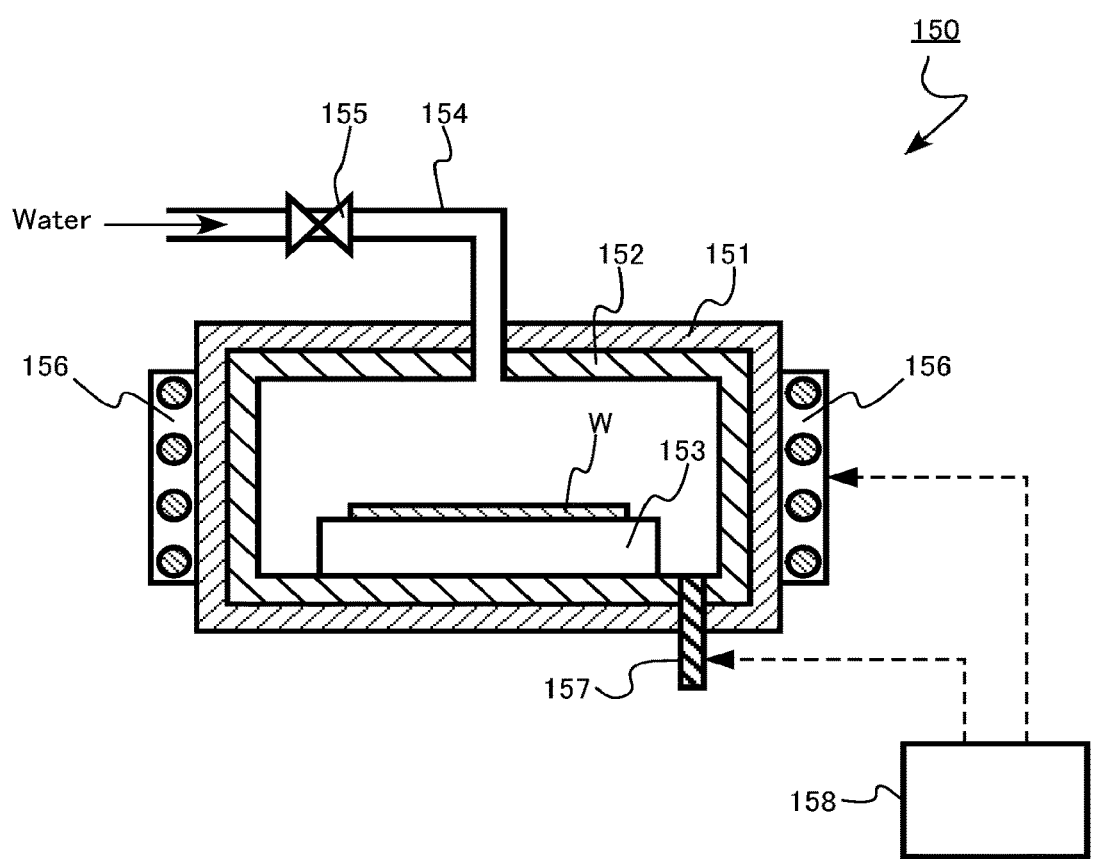
FIG. 3 is a schematic diagram of a substrate treatment apparatus according to the first embodiment.

FIG. 3 is a schematic diagram of a substrate treatment apparatus according to the first embodiment. A substrate treatment apparatus 150 according to the first embodiment is used for forming the aluminum hydroxide film 53.

The substrate treatment apparatus 150 includes a pressure vessel 151, an anti-contamination liner layer 152, a holder 153, a liquid supply passage 154, a valve 155, a heater 156, a pressure adjusting valve 157, and a control circuit 158. The anti-contamination liner layer 152 is an example of a resin layer.

The pressure vessel 151 is resistant to pressure, for example, equal to or more than 15 MPa and equal to or less than 100 MPa. The pressure vessel 151 is resistant to temperature, for example, equal to or more than 250° C. and equal to or less than 400° C. The pressure vessel 151 is, for example, stainless steel. The pressure vessel 151 may be, for example, cylinder-shaped or anvil-shaped, or may has one or more flanges. The pressure vessel 151 may have a mechanism, which is not shown by FIG. 3, whereby the lid is screwed or clamped to the body. The lid may be in the form of a hatch, or may be completely detached from the body, or may be held in place by a lift or the like.

The anti-contamination liner layer 152 covers the inner surface of the pressure vessel 151. The anti-contamination liner layer 152 has, for example, a function of suppressing metal contamination generated from the pressure vessel 151. The anti-contamination liner layer 152 is, for example, a polybenzoimidal resin (PBI resin), a polytetrafluoroethylene resin (PTFE resin), or a polyimide resin (PI resin), or may be a combination of these resins or a combination of these resins and other materials. Instead of the anti-contamination liner layer 152, an anti-contamination container may be used. In this case, the anti-contamination container is an example of the resin layer. The anti-contamination container is, for example, a polybenzoimidal resin (PBI resin), a polytetrafluoroethylene resin (PTFE resin), a polyimide resin (PI resin), or a material obtained by combining these resins or a material obtained by combining these resins with other materials. The anti-contamination container may be a double layer of an outer anti-contamination container and an inner anti-contamination container, or may be a combination of a plurality of containers. The lid of the anti-contamination container may be interlocked with the lid of the pressure vessel or may be configured to operate separately with the lid of the pressure vessel.

The holder 153 is provided in the pressure vessel 151. The holder 153 is configured to hold a wafer W. The wafer W is mounted on the holder 153. The wafer W is an example of a substrate.

The liquid supply passage 154 is connected to the inside of the pressure vessel 151. The liquid supply passage 154 supplies a liquid containing water into the pressure vessel 151. The liquid supply passage 154 may have a liquid supply passage liner layer corresponding to the anti-contamination liner layer 152 inside.

The valve 155 is provided in the liquid supply passage 154. By opening and closing the valve 155, the supply of the liquid to the inside of the pressure vessel 151 is started and stopped. The liquid supply passage liner layer corresponding to the anti-contamination liner layer 152 may be provided inside the valve 155 or inside the valve body.

The heater 156 heats the pressure vessel 151. By heating the pressure vessel 151, the liquid inside the pressure vessel 151 is heated. Using the heater 156, the liquid inside the pressure vessel 151 is heated to, for example, a temperature equal to or more than 250° C. and equal to or less than 400° C. The heating of the liquid inside the pressure vessel 151 increases the pressure inside the pressure vessel 151.

The pressure adjusting valve 157 is attached to the pressure vessel 151. The pressure adjusting valve 157 adjusts the pressure in the pressure vessel 151. The pressure adjusting valve 157 may be a safety valve for preventing the internal pressure of the pressure vessel 151 from becoming excessively high. The pressure adjusting valve 157 may have a liquid pressure adjusting valve liner layer corresponding to the anti-contamination liner layer 152 inside.

The control circuit 158 controls the heater 156 and the pressure adjusting valve 157. By controlling the heater 156 and the pressure adjusting valve 157, the control circuit 158 controls the inside of the pressure vessel 151 so as to satisfy the predetermined conditions that the temperature is in a range equal to or more than 250° C. and equal to or less than 400° C. and the pressure is in a range equal to or more than 15 MPa and equal to or less than 100 MPa, for example.

The substrate treatment apparatus 150 includes, for example, a thermometer (not shown) for measuring the temperature inside the pressure vessel 151. In addition, the substrate treatment apparatus 150 may include, for example, a pressure gauge (not shown) for measuring the pressure in the pressure vessel 151. When the pressure vessel 151 does not include a pressure gauge, the pressure adjusting valve 157 can function as a safety valve.

For example, based on the measured value of the thermometer and the measured value of the pressure gauge, the control circuit 158 controls the heater 156 and the pressure adjusting valve 157 so that the inside of the pressure vessel 151 satisfies the predetermined conditions. The pressure adjusting valve 157 does not necessarily have to have a function of changing the pressure adjustment value, and the pressure adjusting valve 157 may be designed in advance so as to have a sufficient margin for the breakdown voltage of the pressure vessel 151, so that the pressure adjusting valve 157 has a function of releasing the pressure with a pressure value that cannot be changed by the apparatus user.

The control circuit 158 includes, for example, hardware and software. The control circuit 158 includes, for example, an electronic circuit. The control circuit 158 includes, for example, a control program stored in a memory device. It is preferable that the memory device has a control program that keeps the temperature at a specified value even if the supply of power is stopped and a non-volatile memory that does not lose the control recipe showing the time change pattern of the temperature.

When the aluminum hydroxide film 53 is formed from the aluminum nitride film 52 formed on the surface of the wafer W, the wafer W is first carried into the pressure vessel 151 and placed on the holder 153. For example, the wafer W is carried in, for example, by a method in which one side of the pressure vessel 151 has a lid, and opening the lid to feed in the wafer W, and the lid is then closed.

Then, the valve 155 is opened, and for example, water is supplied from the liquid supply passage 154 into the pressure vessel 151. The pressure vessel 151 is filled with water. The water is preferably pure water, but water whose hydrogen ion concentration index (pH) has been adjusted by adding an acid or an alkali may also be used.

Then, the valve 155 is closed, and the pressure vessel 151 is heated by using the heater 156 so that the water in the pressure vessel 151 is heated. By heating the water in the pressure vessel 151, the pressure in the pressure vessel 151 increases. The water in the pressure vessel 151 is, for example, supercritical water or subcritical water.

The control circuit 158 controls the heater 156 and the pressure adjusting valve 157 to make a control so that the temperature and pressure inside the pressure vessel 151 satisfy the predetermined conditions. The pressure adjusting valve 157 is not always controlled, and may have a function as a safety valve.

By treating the wafer W for a predetermined time in a state in which the temperature and pressure inside the pressure vessel 151 satisfy the predetermined conditions, the aluminum nitride film 52 is changed to the aluminum hydroxide film 53. Here, at least the outermost surface of the aluminum nitride film 52 may be changed to an aluminum hydroxynitride film containing Al, O, N, and H or the like before being introduced into the pressure vessel 151, but it is preferable that the change of the aluminum nitride film 52 before being introduced into the pressure vessel 151 is small.

After treating the wafer W for a predetermined time, the heater 156 is turned off, and water is discharged from, for example, a liquid discharge passage (not shown) provided in the pressure vessel 151. Then, the wafer W is carried out of the pressure vessel 151. Here, after turning off the heater 156, there may be a step of waiting for the water in the pressure vessel 151 to be discharged until the pressure or temperature in the pressure vessel 151 decreases up to a pressure or temperature that does not cause a safety problem in or around the apparatus. In addition, the step of discharging the water in the pressure vessel 151 and the step of carrying out the wafer W out of the pressure vessel 151 may be in the reverse order. There may be a step of drying the wafer W carried out of the pressure vessel 151 with a rinse dryer or the like. There may be a step of cleaning the wafer W with water or chemicals.

Figure 2D:
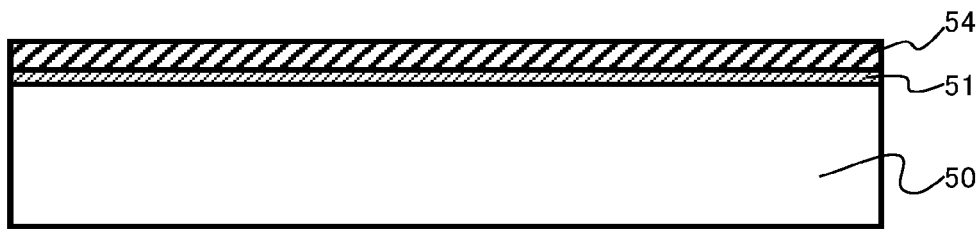

Then, the aluminum hydroxide film 53 is heat-treated at a temperature equal to or more than 500° C. and equal to or less than 800° C. to form an aluminum oxide film 54 containing α-type aluminum oxide (FIG. 2D).

The heat treatment is performed, for example, in an oxidizing atmosphere. The heat treatment is performed, for example, in an atmosphere containing oxygen (O). The heat treatment is performed, for example, in an atmosphere containing oxygen gas.

The heat treatment is performed, for example, in an atmosphere containing oxygen (O) and hydrogen (H). The heat treatment is performed, for example, in an atmosphere containing oxygen gas and hydrogen gas. The heat treatment is performed by, for example, in-situ steam generation (ISSG) oxidation.

The heat treatment is performed, for example, in a non-oxidizing atmosphere. The heat treatment is performed, for example, in an atmosphere containing argon (Ar). The heat treatment is performed, for example, in an atmosphere containing nitrogen (N). The heat treatment is performed, for example, in an atmosphere containing argon gas. The heat treatment is performed, for example, in an atmosphere containing nitrogen gas.

The pressure of the heat treatment is, for example, equal to or less than atmospheric pressure. The atmosphere during the heat treatment is controlled so that, for example, carbon dioxide ($CO_2$) is less than 400 ppm.

The aluminum oxide film 54 finally becomes the upper layer 12b. The lower layer 12a and the upper layer 12b form the gate insulating layer 12.

Figure 2E:
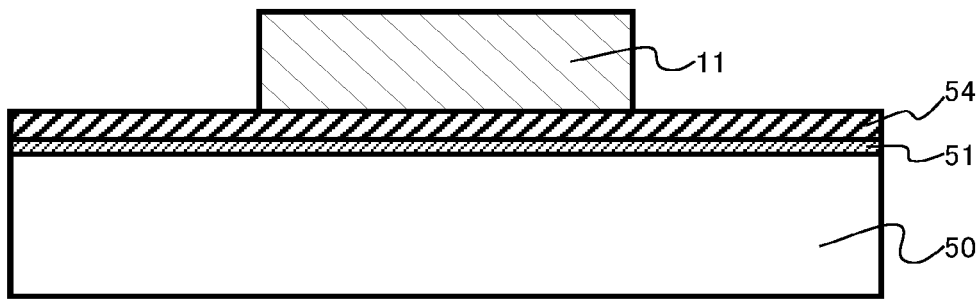

Then, the gate electrode layer 11 is formed on the aluminum oxide film 54 by a known process technique (FIG. 2E). Then, an n-type impurity region is formed in the single crystal silicon layer 50 by using an ion implantation method. The n-type impurity region becomes the source region 10a and the drain region 10b.

By the manufacturing method described above, the MOSFET 100 shown in FIG. 1 is manufactured.

Next, the function and effect of the semiconductor device and the semiconductor device manufacturing method according to the first embodiment will be described.

A logic device includes a scaled-down MOSFET in order to improve the performance of the device. The scaled-down MOSFET requires a gate insulating layer that is thin and has a small leakage current.

In addition, it is desirable that the gate insulating layer of the MOSFET can be formed by a low temperature process. Since the gate insulating layer of the MOSFET can be formed at a low temperature, for example, merged formation of another device and the MOSFET in one chip becomes easy.

In the MOSFET 100 according to the first embodiment, the gate insulating layer 12 has, for example, a thin upper layer 12b having a thickness equal to or less than 5 nm. The aluminum oxide contained in the upper layer 12b contains α-type aluminum oxide. Since the aluminum oxide contained in the upper layer 12b contains α-type aluminum oxide, the leakage current of the upper layer 12b is reduced.

The α-type aluminum oxide (α-alumina) has a smaller leakage current than other crystal phases such as γ-type aluminum oxide (γ-alumina) and θ-type aluminum oxide (θ-alumina). It is considered that the leakage current is reduced because the α-type aluminum oxide has a large bandgap and a low defect density in the film as compared with other crystal phases.

The aluminum oxide contained in the upper layer 12b preferably contains α-type aluminum oxide as a main component. Since the aluminum oxide contained in the upper layer 12b contains α-type aluminum oxide as a main component, the leakage current of the gate insulating layer 12 is reduced.

The upper layer 12b preferably contains diaspore-type aluminum hydroxide. Since the upper layer 12b contains diaspore-type aluminum hydroxide, hydrogen (H) contained in the aluminum hydroxide repairs the dangling bond of the aluminum oxide contained in the upper layer 12b. Therefore, the reliability of the gate insulating layer 12 is improved.

For example, by adjusting the heat treatment time when forming the aluminum oxide film 54 from the aluminum hydroxide film 53, the diaspore-type aluminum hydroxide can remain in the aluminum oxide film 54.

The upper layer 12b preferably contains sulfur (S) or chlorine (Cl). The sulfur (S) or chlorine (Cl) contained in the upper layer 12b is derived from, for example, sulfuric acid or hydrochloric acid contained in the fluid when the upper layer 12b is formed.

The upper layer 12b preferably contains nitrogen (N). The nitrogen (N) contained in the upper layer 12b is derived from, for example, nitric acid or ammonia contained in the fluid when the upper layer 12b is formed.

By the manufacturing method according to the first embodiment, the gate insulating layer 12 according to the first embodiment is formed. In the manufacturing method according to the first embodiment, the aluminum hydroxide film 53 containing diaspore-type aluminum hydroxide is formed from the aluminum nitride film 52 by treatment in a fluid containing water. Then, the aluminum oxide film 54 is formed from the aluminum hydroxide film 53. According to this manufacturing method, the aluminum oxide film 54 containing α-type aluminum oxide can be formed by heat treatment at a low temperature that is equal to or less than 800° C. The details will be described below.

For example, when an amorphous aluminum oxide film formed by a chemical vapor deposition method (CVD method) is heat-treated and crystallized to form an aluminum oxide film containing α-type aluminum oxide, a temperature equal to or more than 1000° C. is required.

In the manufacturing method according to the first embodiment, the diaspore-type aluminum hydroxide is heat-treated to form α-type aluminum oxide. For example, the α-type aluminum oxide can be formed from the diaspore-type aluminum hydroxide by heat treatment at a temperature equal to or less than 800° C. under atmospheric pressure.

Therefore, in the manufacturing method according to the first embodiment, the aluminum oxide film 54 containing α-type aluminum oxide can be formed at a low temperature from the aluminum hydroxide film 53 containing diaspore-type aluminum hydroxide.

For example, when α-type aluminum oxide is formed by heat-treating boehmite-type aluminum hydroxide, heat treatment at a temperature equal to or more than 1000° C. under atmospheric pressure is required. The boehmite-type aluminum hydroxide has a crystal structure of space group No. 63 Amara. The boehmite-type aluminum hydroxide is expressed as, for example, AlO(OH) in the chemical formula. The diaspore-type aluminum hydroxide is a crystal phase that is stable at higher pressure than the boehmite-type aluminum hydroxide.

In the manufacturing method according to the first embodiment, aluminum nitride is treated in a high-pressure fluid containing water to form diaspore-type aluminum hydroxide. For example, diaspore-type aluminum hydroxide, which is a crystal phase that is stable at high pressure, can be formed by performing a treatment in a fluid containing water at a temperature equal to or more than 250° C. and equal to or less than 400° C. and a pressure equal to or more than 15 MPa and equal to or less than 100 MPa.

In addition, in the manufacturing method according to the first embodiment, by forming aluminum hydroxide from aluminum nitride, aluminum hydroxide can be formed at a lower temperature and in a shorter time than, for example, in the case of forming aluminum hydroxide from aluminum oxide. Therefore, in the manufacturing method according to the first embodiment, the aluminum hydroxide film 53 containing diaspore-type aluminum hydroxide can be formed from the aluminum nitride film 52 at a low temperature and in a short time.

As described above, according to the manufacturing method of the first embodiment, the aluminum oxide film 54 containing α-type aluminum oxide can be formed by heat treatment at a low temperature that is equal to or less than 800° C.

The temperature of the treatment in the fluid containing water is preferably equal to or more than 250° C. and equal to or less than 400° C., more preferably equal to or more than 300° C. and equal to or less than 375° C. When the temperature of the treatment in the fluid containing water exceeds the above lower limit, the formation of diaspore-type aluminum hydroxide is promoted. In addition, when the temperature of the treatment in the fluid containing water falls below the above upper limit, the decomposition of aluminum hydroxide is suppressed.

The pressure of the treatment in the fluid containing water is preferably equal to or more than 15 MPa and equal to or less than 100 MPa, more preferably equal to or more than 20 MPa and equal to or less than 80 MPa, and even more preferably equal to or more than 30 MPa and equal to or less than 50 MPa. When the pressure of the treatment in the fluid containing water exceeds the above lower limit, the formation of diaspore-type aluminum hydroxide is promoted. In addition, when the pressure of the treatment in the fluid containing water falls below the above upper limit, the performance required for the substrate treatment apparatus 150 is lowered, so that the process cost for forming the aluminum hydroxide film 53 can be reduced.

The fluid containing water is preferably acidic or alkaline. By making the fluid containing water acidic or alkaline, the temperature or pressure for forming diaspore-type aluminum hydroxide can be reduced.

When the fluid containing water is acidic, the fluid containing water contains, for example, nitric acid, sulfuric acid, or hydrochloric acid. When the fluid containing water is alkaline, the fluid containing water contains, for example, ammonia.

In the treatment of a fluid containing water, it is preferable to set the temperature to be equal to or more than 250° C. and the pressure to be equal to or more than 15 MPa within 30 minutes after the aluminum nitride film 52 comes into contact with the fluid. When aluminum nitride is in contact with a fluid containing water under atmospheric pressure, for example, the formation of boehmite-type aluminum hydroxide is promoted. Excessive formation of boehmite-type aluminum hydroxide may inhibit the subsequent formation of diaspore-type aluminum hydroxide. Therefore, in the treatment of a fluid containing water, it is preferable to set the temperature to be equal to or more than 250° C. and the pressure to be equal to or more than 15 MPa within 30 minutes after the aluminum nitride film 52 comes into contact with the fluid.

In the treatment of a fluid containing water, the fluid is preferably a subcritical fluid. When the fluid is a subcritical fluid, the formation of diaspore-type aluminum hydroxide is promoted. The fluid may be a supercritical fluid. When the fluid is a supercritical fluid, the formation of diaspore-type aluminum hydroxide is promoted.

As described above, according to the first embodiment, it is possible to provide a semiconductor device including an insulating layer having a small leakage current. In addition, according to the first embodiment, it is possible to provide a method for manufacturing a semiconductor device including an insulating layer having a small leakage current.

Second Embodiment

A semiconductor memory device manufacturing method according to a second embodiment comprising: forming a stacked structure including an oxide layer and a nitride layer alternately stacked in a first direction; forming a hole extending in the first direction in the stacked structure; forming a charge storage layer inside the hole; forming a first insulating film inside the hole; forming a semiconductor layer inside the hole; removing the nitride layer selectively with respect to the oxide layer; forming an aluminum nitride film in a region where the nitride layer has been removed; forming an aluminum hydroxide film containing diaspore-type aluminum hydroxide by performing treatment in a fluid containing water to the aluminum nitride film; forming an aluminum oxide film containing α-type aluminum oxide by performing heat treatment to the aluminum hydroxide film at a temperature equal to or more than 500° C. and equal to or less than 800° C.; and forming a conductive film in the region.

The semiconductor memory device according to the second embodiment is a three-dimensional NAND flash memory. A memory cell of the semiconductor memory device according to the second embodiment is a so-called metal-oxide-nitride-oxide-semiconductor type (MONOS type) memory cell.

In addition, a block insulating layer of the memory cell of the semiconductor memory device according to the second embodiment is formed by using the same manufacturing method as the semiconductor device manufacturing method according to the first embodiment. Hereinafter, the description of a part of the content overlapping the first embodiment may be omitted.

Figure 4:
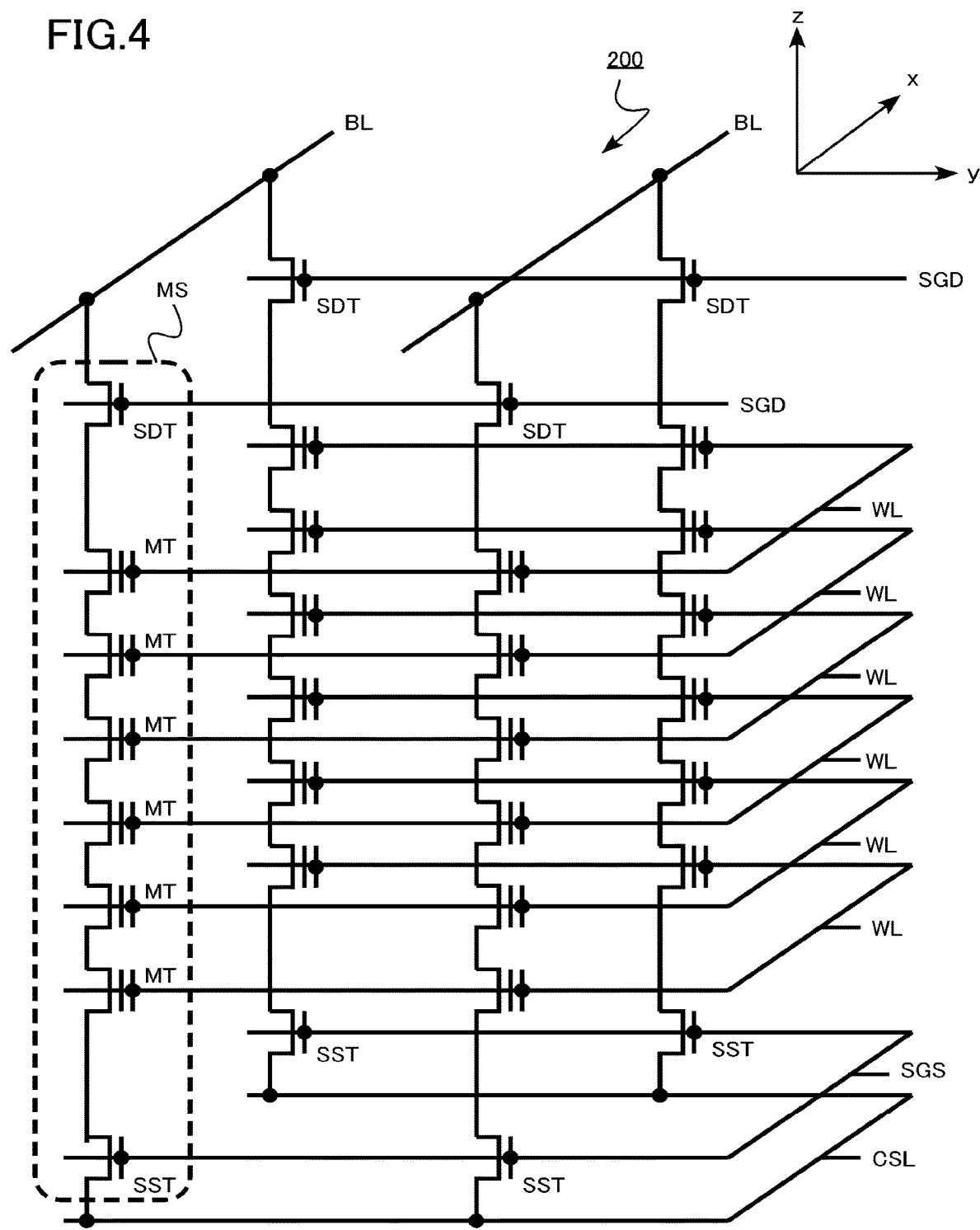
FIG. 4 is a circuit diagram of a memory cell array of a semiconductor memory device according to a second embodiment.

FIG. 4 is a circuit diagram of a memory cell array of the semiconductor memory device according to the second embodiment.

As shown in FIG. 4, a memory cell array 200 of the three-dimensional NAND flash memory according to the second embodiment includes a plurality of word lines WL, a common source line CSL, a source selection gate line SGS, a plurality of drain selection gate lines SGD, a plurality of bit lines BL, and a plurality of memory strings MS.

The plurality of word lines WL are arranged so as to be spaced from each other in a z direction. The plurality of word lines WL are arranged so as to be stacked in the z direction. The plurality of memory strings MS extend in the z direction. The plurality of bit lines BL extend in the x direction, for example.

Hereinafter, the x direction is defined as a third direction, the y direction is defined as a second direction, and the z direction is defined as a first direction. The x direction, the y direction, and the z direction cross each other. For example, the x direction, the y direction, and the z direction are perpendicular to each other.

As shown in FIG. 4, each memory string MS includes a source selection transistor SST, a plurality of memory cells, and a drain selection transistor SDT connected in series to each other between the common source line CSL and the bit line BL. One memory string MS can be selected by selecting one bit line BL and one drain selection gate line SGD, and one memory cell can be selected by selecting one word line WL. The word line WL is a gate electrode of a memory cell transistor MT configuring the memory cell.

Figure 5A:
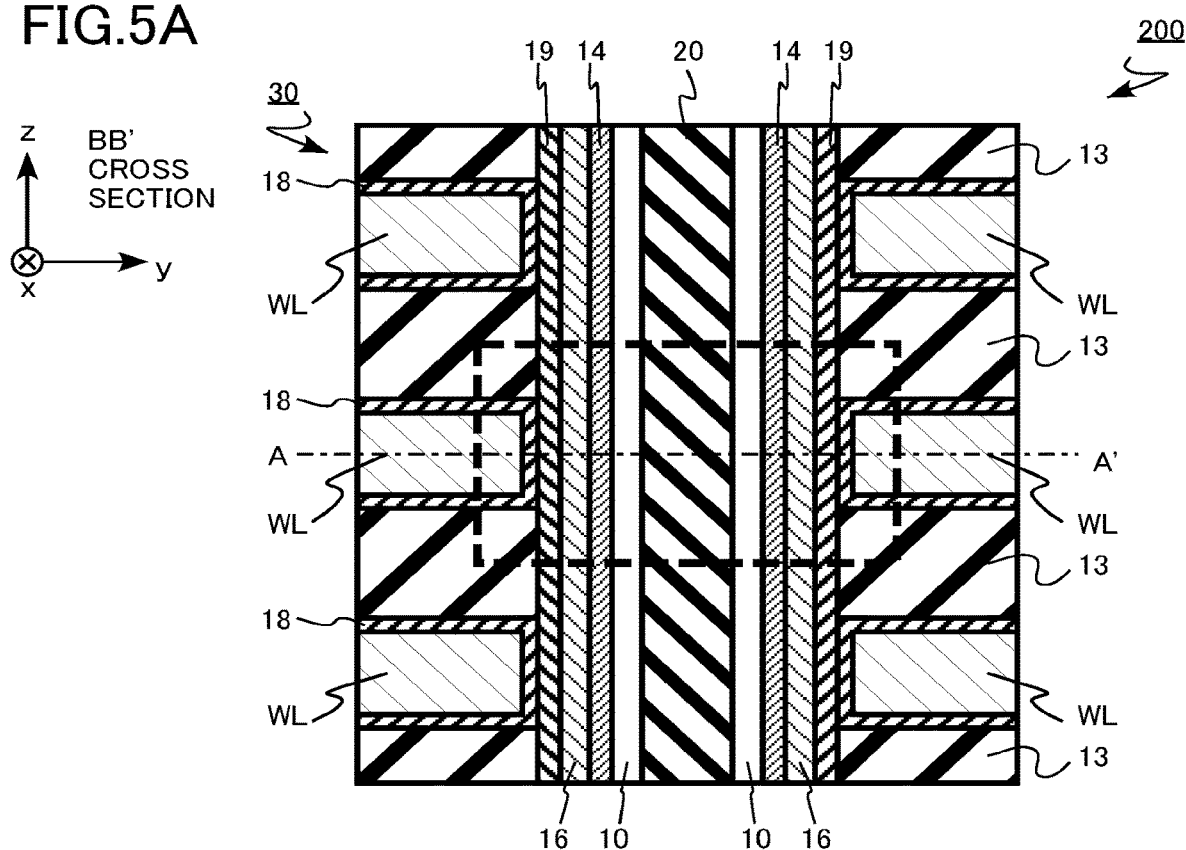
FIGS. 5A and 5B are schematic cross-sectional views of a memory cell array of the semiconductor memory device according to the second embodiment.
Figure 5B:
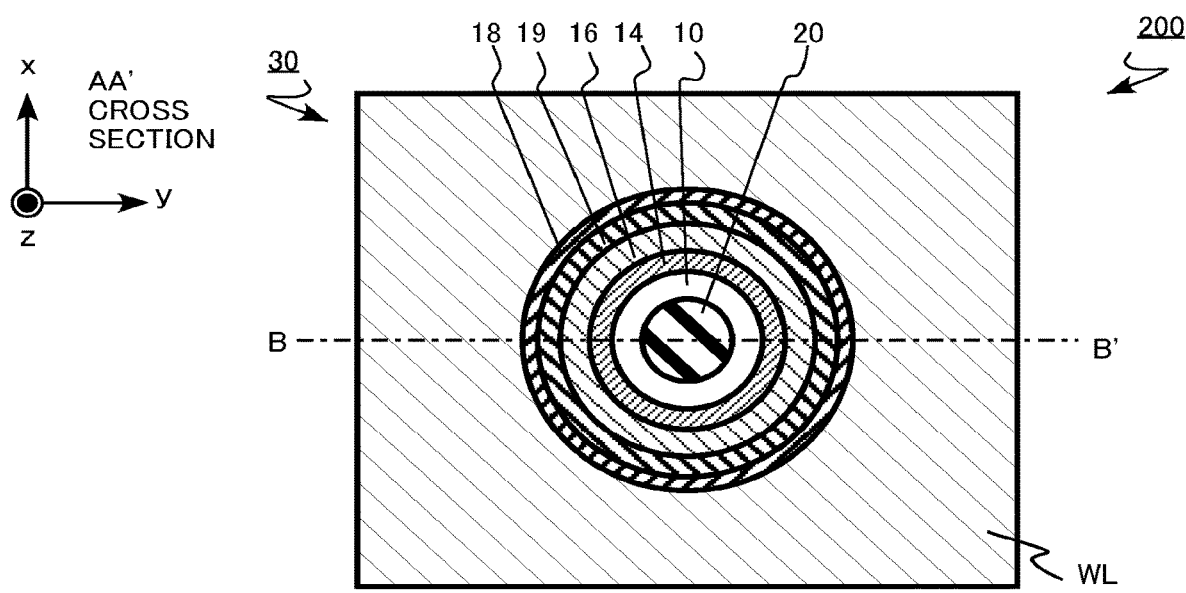

FIGS. 5A and 5B are schematic cross-sectional views of a memory cell array of the semiconductor memory device according to the second embodiment. FIGS. 5A and 5B show cross sections of a plurality of memory cells in one memory string MS in the memory cell array 200 shown in FIG. 4.

FIG. 5A is a yz cross-sectional view of the memory cell array 200. FIG. 5A is a cross-sectional view taken along the line BB' of FIG. 5B. FIG. 5B is an xy cross-sectional view of the memory cell array 200. FIG. 5B is a cross-sectional view taken along the line AA' of FIG. 5A. In FIG. 5A, the area surrounded by the broken line is one memory cell.

As shown in FIGS. 5A and 5B, the memory cell array 200 includes a word line WL, a semiconductor layer 10, an interlayer insulating layer 13, a tunnel insulating layer 14, a charge storage layer 16, a first block insulating layer 18, a second block insulating layer 19, and a core insulating region 20. A plurality of word lines WL and a plurality of interlayer insulating layers 13 form a stacked body 30.

The word line WL is an example of a gate electrode layer. The interlayer insulating layer 13 is an example of the fourth insulating layer. The tunnel insulating layer 14 is an example of the first insulating layer. The first block insulating layer 18 is an example of the second insulating layer. The second block insulating layer 19 is an example of the second or third insulating layer.

The memory cell array 200 is provided, for example, on a semiconductor substrate (not shown). The semiconductor substrate has a surface parallel to the x and y directions.

The word line WL and the interlayer insulating layer 13 are alternately stacked in the z direction on the semiconductor substrate. The word lines WL are repeatedly arranged in the z direction so as to be spaced from each other. A plurality of word lines WL and a plurality of interlayer insulating layers 13 form the stacked body 30. The word line WL functions as a control electrode of the memory cell transistor MT.

The word line WL is a plate-shaped conductor. The word line WL is, for example, a metal, a metal nitride, a metal carbide, or a semiconductor. The word line WL has, for example, a stacked structure of a metal nitride and a metal. The word line WL has, for example, a stacked structure of titanium nitride and tungsten (W). The thickness of the word line WL in the z direction is, for example, equal to or more than 5 nm and equal to or less than 20 nm.

The interlayer insulating layer 13 separates the word line WL and the word line WL from each other. The interlayer insulating layer 13 electrically separates the word line WL and the word line WL from each other.

The interlayer insulating layer 13 is, for example, an oxide, an oxynitride, or a nitride. The interlayer insulating layer 13 contains, for example, silicon (Si) and oxygen (O). The interlayer insulating layer 13 is, for example, a silicon oxide. The thickness of the interlayer insulating layer 13 in the z direction is, for example, equal to or more than 5 nm and equal to or less than 20 nm.

The semiconductor layer 10 is provided in the stacked body 30. The semiconductor layer 10 extends in the z direction. The semiconductor layer 10 extends in a direction perpendicular to the surface of the semiconductor substrate.

The semiconductor layer 10 is provided so as to penetrate the stacked body 30. The semiconductor layer 10 is surrounded by a plurality of word lines WL. The semiconductor layer 10 is, for example, cylindrical. The semiconductor layer 10 functions as a channel of the memory cell transistor MT.

The semiconductor layer 10 is, for example, a polycrystalline semiconductor. The semiconductor layer 10 is, for example, polycrystalline silicon.

The tunnel insulating layer 14 is provided between the semiconductor layer 10 and the word line WL. The tunnel insulating layer 14 is provided between the semiconductor layer 10 and at least one of the plurality of word lines WL. The tunnel insulating layer 14 is provided between the semiconductor layer 10 and the charge storage layer 16. The tunnel insulating layer 14 has a function of allowing a charge to pass according to a voltage applied between the word line WL and the semiconductor layer 10.

The tunnel insulating layer 14 contains, for example, silicon (Si), nitrogen (N), and oxygen (O). The tunnel insulating layer 14 contains, for example, silicon oxide, silicon nitride, or silicon oxynitride. The thickness of the tunnel insulating layer 14 is, for example, equal to or more than 3 nm and equal to or less than 8 nm.

The charge storage layer 16 is provided between the tunnel insulating layer 14 and the first block insulating layer 18. The charge storage layer 16 is provided between the tunnel insulating layer 14 and the second block insulating layer 19.

The charge storage layer 16 has a function of trapping and storing a charge. The charge is, for example, an electron. The threshold voltage of the memory cell transistor MT changes according to the amount of charge stored in the charge storage layer 16. By using the threshold voltage change, one memory cell can store data.

For example, when the threshold voltage of the memory cell transistor MT changes, the voltage at which the memory cell transistor MT is turned on changes. For example, if a state in which the threshold voltage is high is defined as data "0" and a state in which the threshold voltage is low is defined as data "1", the memory cell can store 1-bit data of "0" and "1".

The charge storage layer 16 is, for example, an insulating layer. The charge storage layer 16 contains, for example, silicon (Si) and nitrogen (N). The charge storage layer 16 contains, for example, silicon nitride. The thickness of the charge storage layer 16 is, for example, equal to or more than 3 nm and equal to or less than 10 nm.

The first block insulating layer 18 and the second block insulating layer 19 are provided between the tunnel insulating layer 14 and the word line WL. The first block insulating layer 18 and the second block insulating layer 19 are provided between the charge storage layer 16 and the word line WL. The first block insulating layer 18 and the second block insulating layer 19 have a function of blocking the current flowing between the charge storage layer 16 and the word line WL.

The first block insulating layer 18 is provided between the charge storage layer 16 and the word line WL. The first block insulating layer 18 is provided between the second block insulating layer 19 and the word line WL.

The interlayer insulating layer 13 is provided in the z direction of the word line WL. The word line WL and the interlayer insulating layer 13 are arranged in the z direction. In the z direction, the first block insulating layer 18 is provided between the word line WL and the interlayer insulating layer 13.

The first block insulating layer 18 is an insulating layer. The first block insulating layer 18 contains aluminum oxide. The first block insulating layer 18 contains aluminum oxide as a main component. The fact that the first block insulating layer 18 contains aluminum oxide as a main component means that the aluminum oxide has the highest mole fraction among the substances contained in the first block insulating layer 18. The first block insulating layer 18 is, for example, an aluminum oxide layer.

The aluminum oxide contained in the first block insulating layer 18 contains α-type aluminum oxide. The α-type aluminum oxide is also called α-alumina. The α-type aluminum oxide has a crystal structure of space group No. 167 R-3c. The α-type aluminum oxide is expressed as, for example, $Al_2O_3$ in the chemical formula.

The aluminum oxide contained in the first block insulating layer 18 contains α-type aluminum oxide as a main component. The fact that the aluminum oxide contained in the first block insulating layer 18 contains α-type aluminum oxide as a main component means that the α-type aluminum oxide has the highest mole fraction among the aluminum oxides contained in the first block insulating layer 18.

The first block insulating layer 18 contains, for example, diaspore-type aluminum hydroxide. The diaspore-type aluminum hydroxide has a crystal structure of space group No. 62 Pbnm. The diaspore-type aluminum hydroxide is expressed as, for example, AlO(OH) in the chemical formula.

The first block insulating layer 18 contains, for example, nitrogen (N). The first block insulating layer 18 contains, for example, sulfur (S) or chlorine (Cl).

The thickness of the first block insulating layer 18 in the y direction from the semiconductor layer 10 toward the word line WL is, for example, equal to or more than 0.5 nm and equal to or less than 5 nm. The thickness of the first block insulating layer 18 in the z direction from the word line WL toward the interlayer insulating layer 13 is, for example, equal to or more than 0.5 nm and equal to or less than 5 nm.

The first block insulating layer 18 may have, for example, a two-layer structure. The first block insulating layer 18 may have, for example, a two-layer structure of an aluminum oxide layer on the word line WL side and a silicon oxide layer on the charge storage layer 16 side.

The second block insulating layer 19 is provided between the charge storage layer 16 and the first block insulating layer 18. The second block insulating layer 19 is provided between the interlayer insulating layer 13 and the semiconductor layer 10. The second block insulating layer 19 is provided between the interlayer insulating layer 13 and the charge storage layer 16.

The second block insulating layer 19 is an insulating layer. The second block insulating layer 19 contains, for example, silicon (Si) and oxygen (O). The second block insulating layer 19 contains, for example, silicon oxide. The second block insulating layer 19 is, for example, a silicon oxide layer. The second block insulating layer 19 contains, for example, aluminum oxide. The second block insulating layer 19 contains, for example, the same material as the first block insulating layer 18. The second block insulating layer 19 is, for example, an aluminum oxide layer.

The thickness of the second block insulating layer 19 in the y direction is, for example, equal to or more than 3 nm and equal to or less than 8 nm.

The second block insulating layer 19 may have, for example, a two-layer structure.

The core insulating region 20 is provided in the stacked body 30. The core insulating region 20 extends in the z direction. The core insulating region 20 is provided so as to penetrate the stacked body 30. The core insulating region 20 is surrounded by the semiconductor layer 10. The core insulating region 20 is surrounded by a plurality of word lines WL. The core insulating region 20 is columnar. The core insulating region 20 is, for example, cylindrical.

The core insulating region 20 is, for example, an oxide, an acid nitride, or a nitride. The core insulating region 20 contains, for example, silicon (Si) and oxygen (O). The core insulating region 20 is, for example, silicon oxide.

Next, an example of a semiconductor memory device manufacturing method according to the second embodiment will be described.

FIGS. 6 to 15 are schematic cross-sectional views showing an example of the semiconductor memory device manufacturing method according to the second embodiment. FIGS. 6 to 15 each show a cross section corresponding to FIG. 5A. FIGS. 6 to 15 are diagrams showing an example of a method for manufacturing the memory cell array 200 of the semiconductor memory device.

Figure 6:
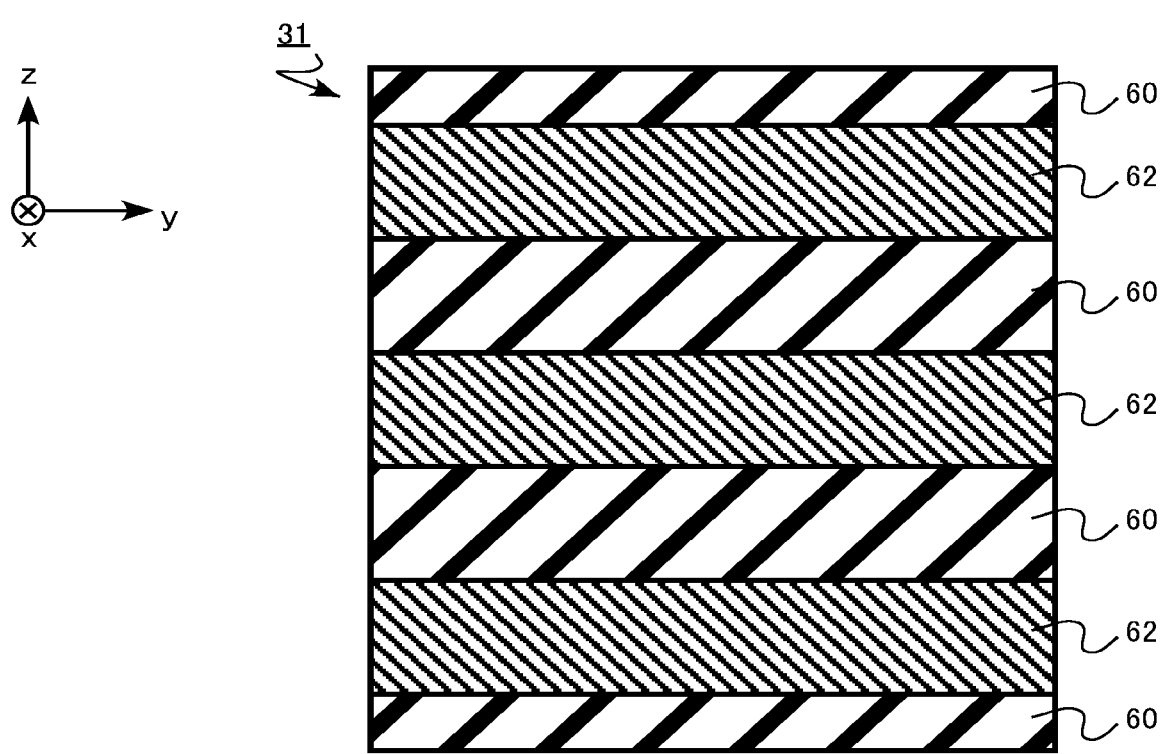
FIG. 6 is a schematic cross-sectional view showing an example of a semiconductor memory device manufacturing method according to the second embodiment.

First, a silicon oxide layer 60 and a silicon nitride layer 62 are alternately stacked on a semiconductor substrate (not shown) (FIG. 6). The silicon oxide layer 60 is an example of an oxide layer. The silicon nitride layer 62 is an example of a nitride layer.

A stacked structure 31 in which a plurality of silicon oxide layers 60 and a plurality of silicon nitride layers 62 are alternately stacked in the z direction is formed. A part of the stacked structure 31 finally becomes a part of the stacked body 30.

The silicon oxide layer 60 and the silicon nitride layer 62 are formed by using, for example, a chemical vapor deposition method (CVD method). A part of the silicon oxide layer 60 finally becomes the interlayer insulating layer 13.

Figure 7:
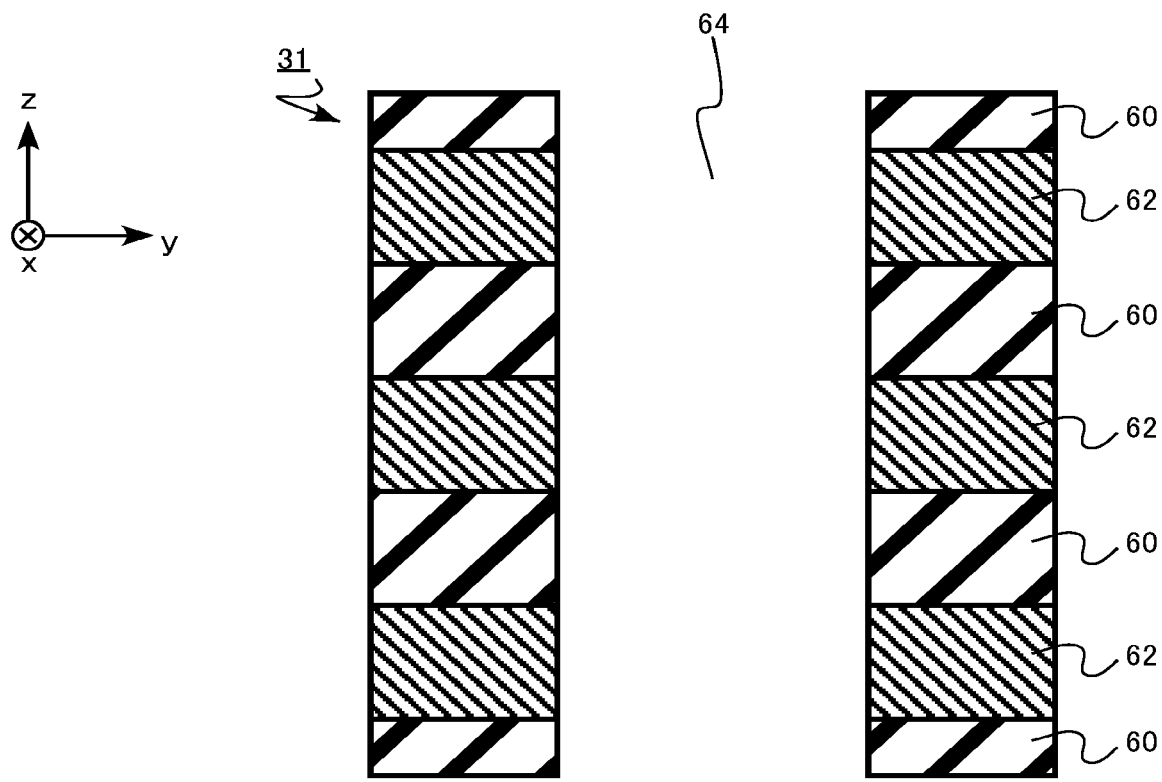
FIG. 7 is a schematic cross-sectional view showing an example of the semiconductor memory device manufacturing method according to the second embodiment.

Then, a memory hole 64 is formed in the silicon oxide layer 60 and the silicon nitride layer 62 (FIG. 7). The memory hole 64 is an example of a hole. The memory hole 64 penetrates the stacked structure 31 and extends in the z direction. The memory hole 64 is formed by using, for example, a lithography method and a reactive ion etching method (RIE method).

Figure 8:
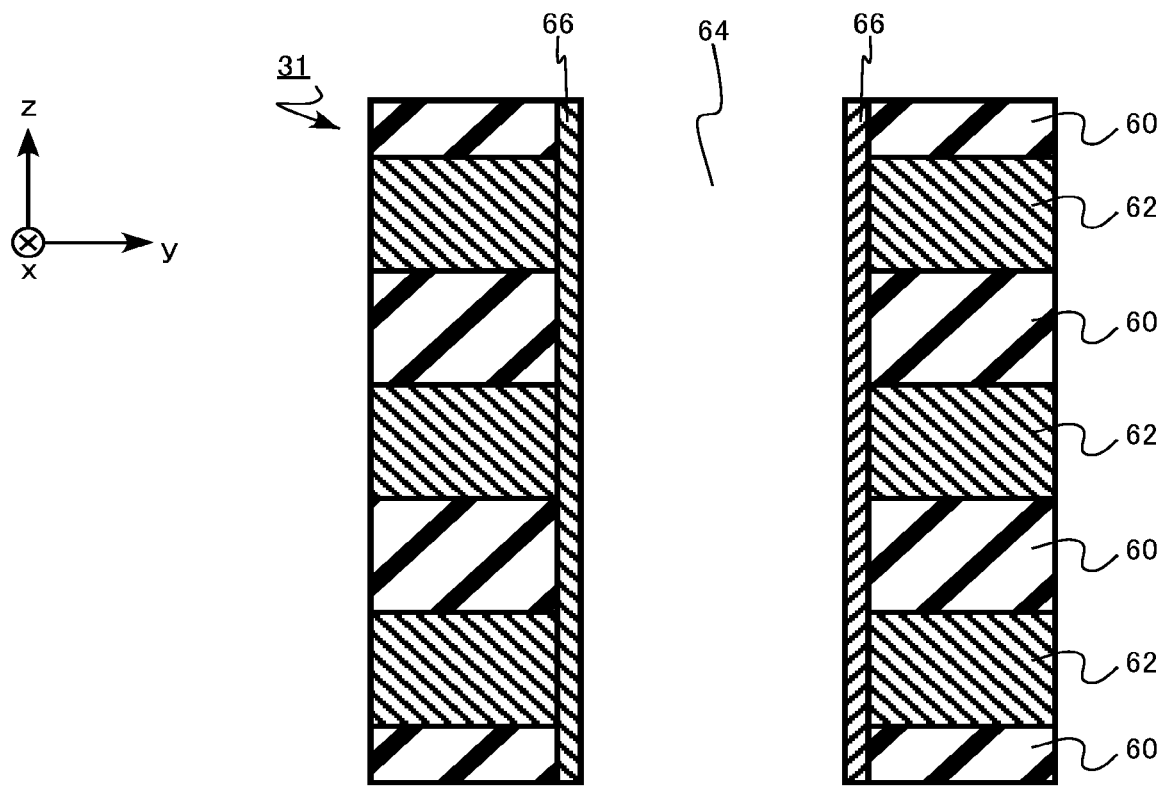
FIG. 8 is a schematic cross-sectional view showing an example of the semiconductor memory device manufacturing method according to the second embodiment.

Then, a silicon oxide film 66 is formed inside the memory hole 64 (FIG. 8). The silicon oxide film 66 is an example of the second insulating film. The silicon oxide film 66 is formed by using, for example, a CVD method. The silicon oxide film 66 finally becomes the second block insulating layer 19.

Then, a silicon nitride film 68 is formed inside the memory hole 64. The silicon nitride film 68 is an example of a charge storage layer. The silicon nitride film 68 is formed on the silicon oxide film 66. The silicon nitride film 68 is formed by using, for example, an ALD method. The silicon nitride film 68 finally becomes the charge storage layer 16.

Then, a stacked insulating film 70 is formed inside the memory hole 64. The stacked insulating film 70 is an example of the first insulating film. The stacked insulating film 70 is formed on the silicon nitride film 68. The stacked insulating film 70 is, for example, a stacked film of a silicon oxide film, a silicon nitride film, and a silicon oxide film.

The stacked insulating film 70 is formed by using, for example, a CVD method. The stacked insulating film 70 finally becomes the tunnel insulating layer 14.

Figure 9:
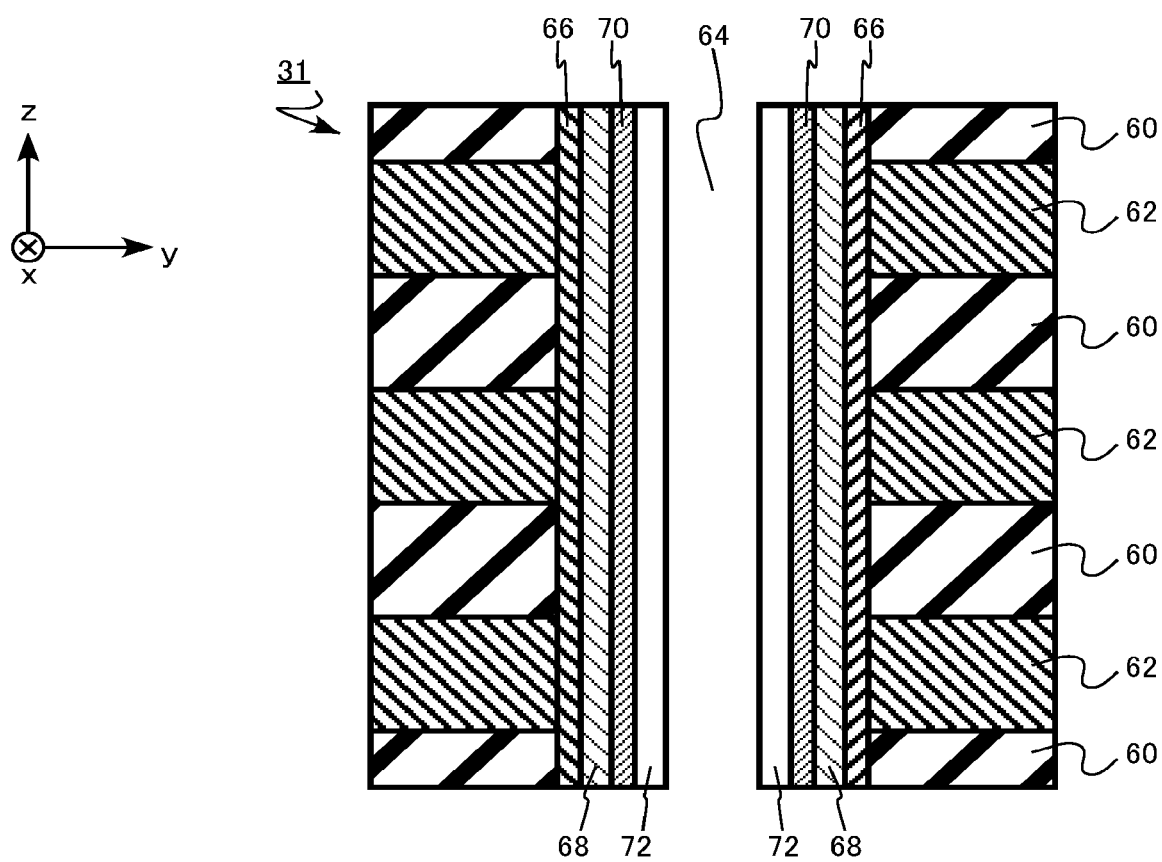
FIG. 9 is a schematic cross-sectional view showing an example of the semiconductor memory device manufacturing method according to the second embodiment.

Then, a polycrystalline silicon film 72 is formed inside the memory hole 64 (FIG. 9). The polycrystalline silicon film 72 is an example of a semiconductor layer. The polycrystalline silicon film 72 is formed on the stacked insulating film 70. The polycrystalline silicon film 72 is formed by using, for example, a CVD method. The polycrystalline silicon film 72 finally becomes the semiconductor layer 10.

Figure 10:
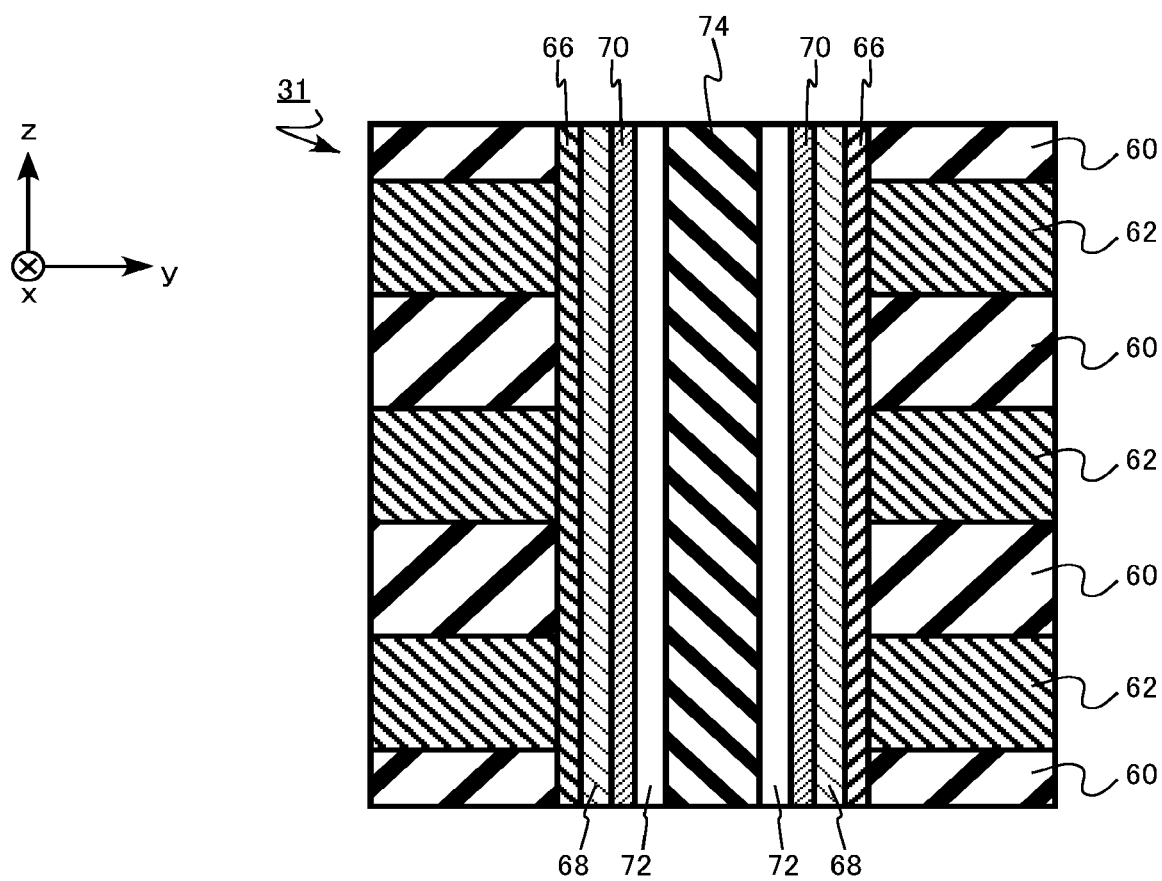
FIG. 10 is a schematic cross-sectional view showing an example of the semiconductor memory device manufacturing method according to the second embodiment.

Then, a silicon oxide film 74 is buried in the memory hole 64 (FIG. 10). The silicon oxide film 74 is formed on the polycrystalline silicon film 72. The silicon oxide film 74 is formed by using, for example, a CVD method. The silicon oxide film 74 finally becomes the core insulating region 20.

Figure 11:
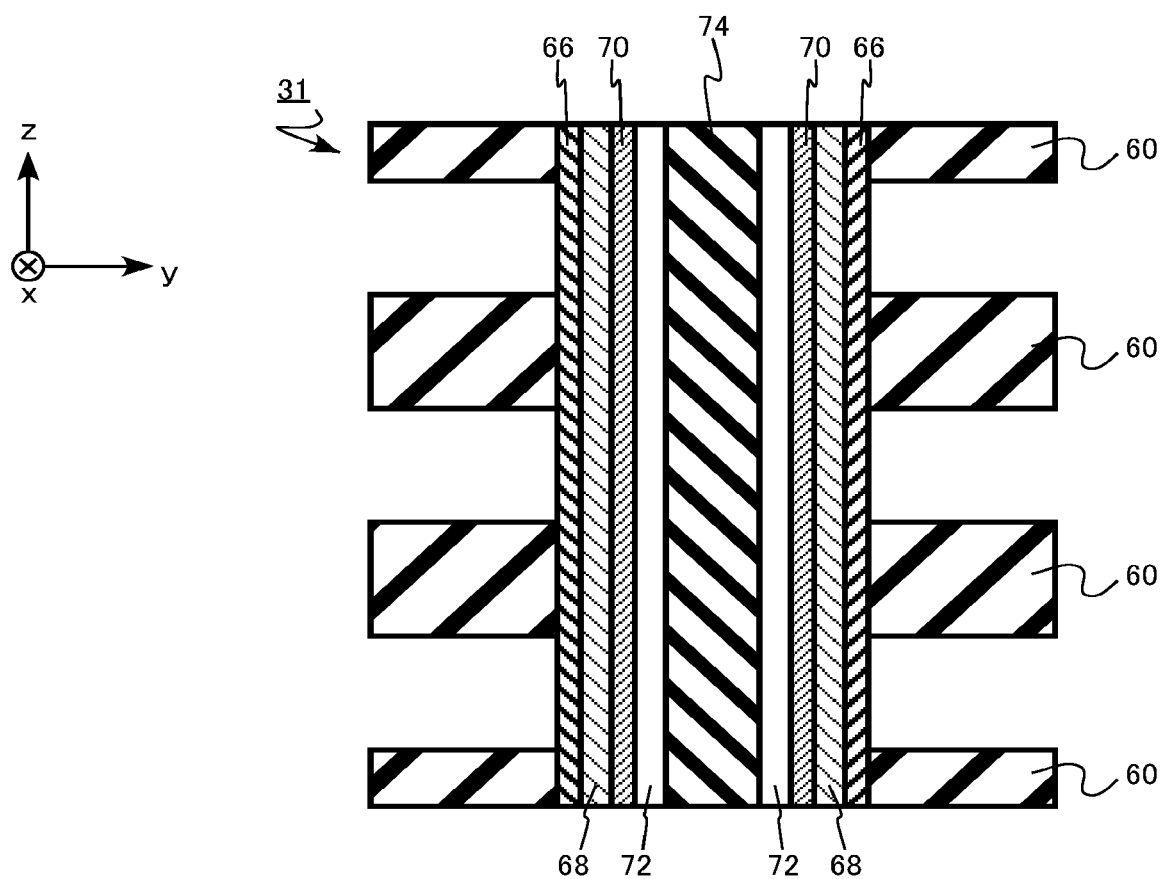
FIG. 11 is a schematic cross-sectional view showing an example of the semiconductor memory device manufacturing method according to the second embodiment.

Then, the silicon nitride layer 62 is selectively removed by wet etching using a groove for etching (not shown) (FIG. 11). The silicon oxide film 66 is exposed by wet etching.

For wet etching, for example, a phosphoric acid solution is used. The silicon nitride layer 62 is etched selectively with respect to the silicon oxide layer 60 and the silicon oxide film 66.

Figure 12:
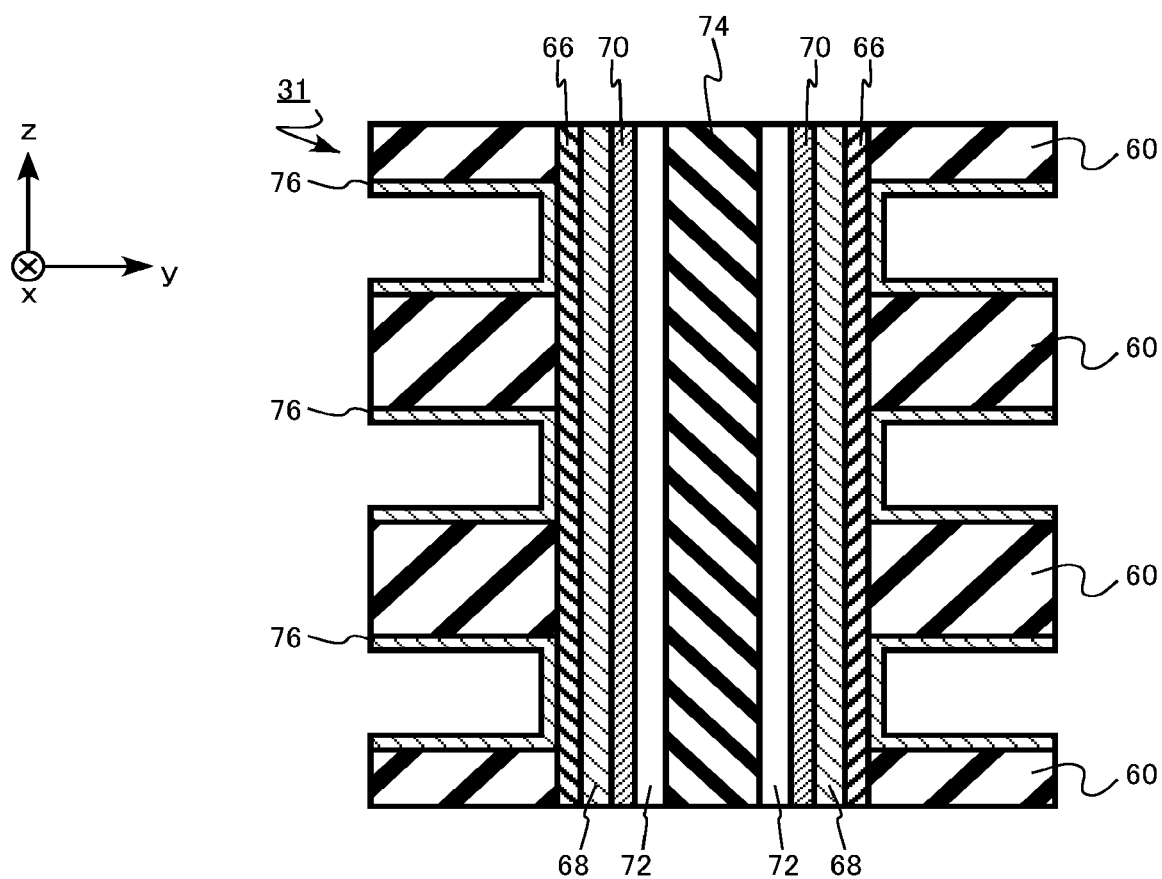
FIG. 12 is a schematic cross-sectional view showing an example of the semiconductor memory device manufacturing method according to the second embodiment.

Then, an aluminum nitride film 76 is formed in a region where the silicon nitride layer 62 has been removed (FIG. 12). The thickness of the aluminum nitride film 76 is, for example, equal to or more than 0.5 nm and equal to or less than 5 nm. The aluminum nitride film 76 is formed by using, for example, an ALD method.

Figure 13:
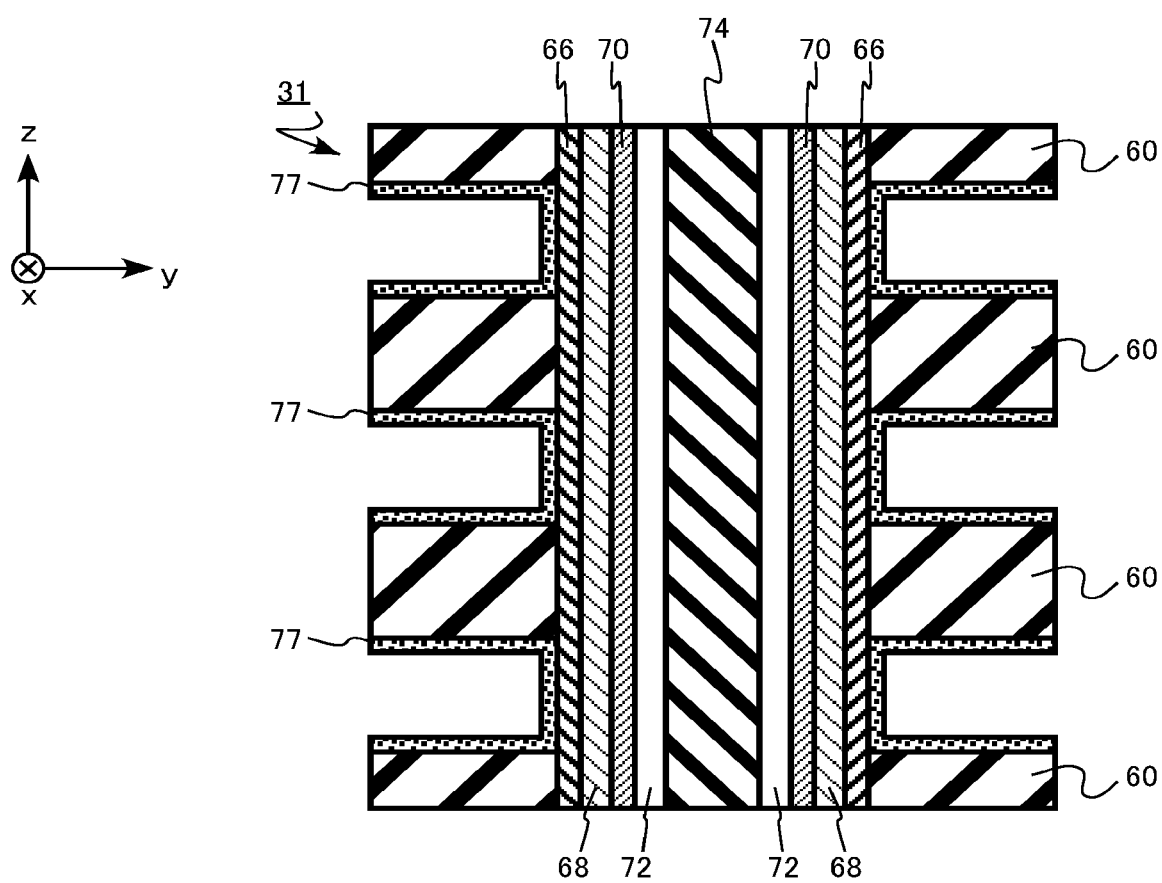
FIG. 13 is a schematic cross-sectional view showing an example of the semiconductor memory device manufacturing method according to the second embodiment.

Then, the aluminum nitride film 76 is treated in a fluid containing water to form an aluminum hydroxide film 77 (FIG. 13). By the treatment in the fluid, the aluminum nitride film 76 is changed to the aluminum hydroxide film 77. The aluminum hydroxide film 77 contains diaspore-type aluminum hydroxide.

The main component of the fluid is water. The fact that a fluid contains water as a main component means that the mole fraction of water is the highest among the substances contained in the fluid. The fluid is, for example, pure water.

The fluid is, for example, acidic or alkaline. The fluid contains, for example, nitric acid, sulfuric acid, hydrochloric acid, or ammonia.

The treatment in the fluid is performed, for example, at a temperature equal to or more than 250° C. and equal to or less than 400° C. and a pressure equal to or more than 15 MPa and equal to or less than 100 MPa. During the treatment in the fluid, for example, the temperature is set to be equal to or more than 250° C. and the pressure is set to be equal to or more than 15 MPa within 30 minutes after the aluminum nitride film 52 comes into contact with the fluid.

The fluid is, for example, a supercritical fluid or a subcritical fluid. The fluid is, for example, supercritical water or subcritical water.

Figure 14:
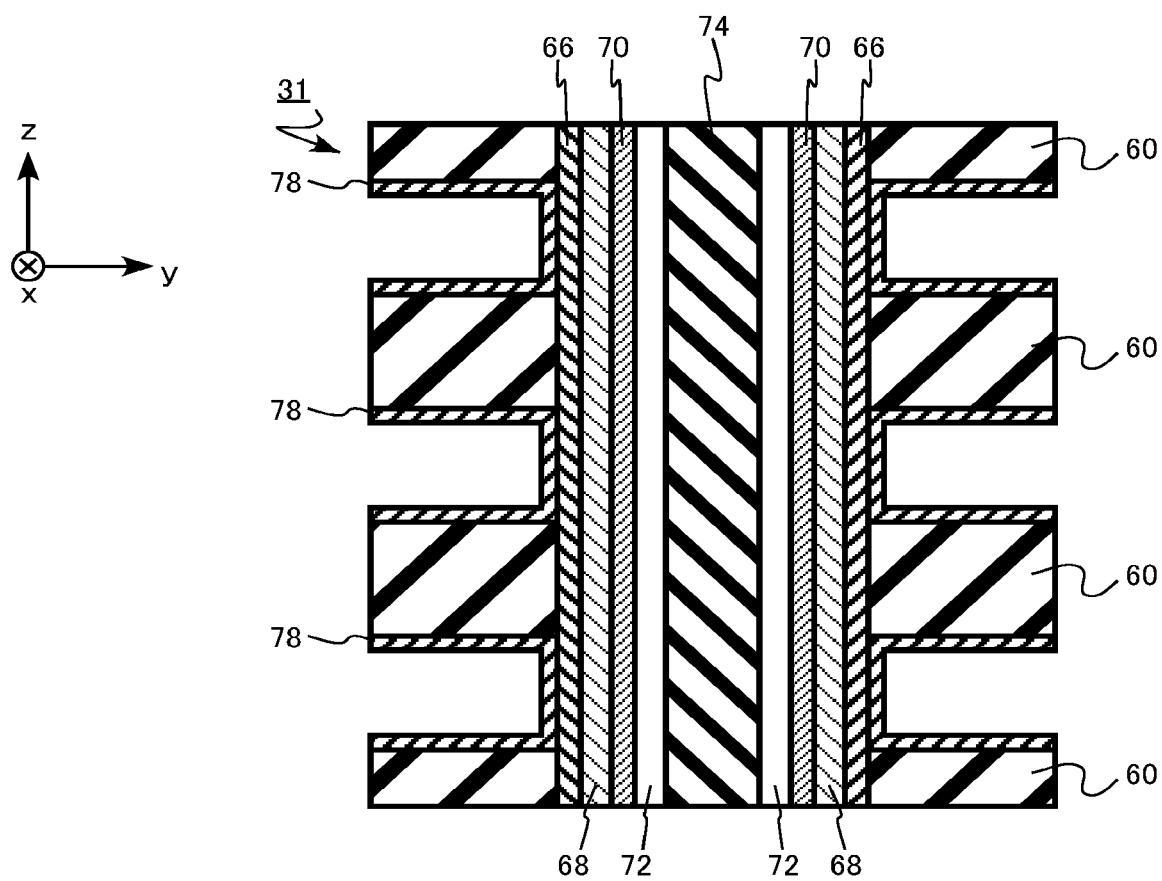
FIG. 14 is a schematic cross-sectional view showing an example of the semiconductor memory device manufacturing method according to the second embodiment.

Then, the aluminum hydroxide film 77 is heat-treated at a temperature equal to or more than 500° C. and equal to or less than 800° C. to form an aluminum oxide film 78 containing α-type aluminum oxide (FIG. 14).

The heat treatment is performed, for example, in an oxidizing atmosphere. The heat treatment is performed, for example, in an atmosphere containing oxygen (O). The heat treatment is performed, for example, in an atmosphere containing oxygen gas.

The heat treatment is performed, for example, in an atmosphere containing oxygen (O) and hydrogen (H). The heat treatment is performed, for example, in an atmosphere containing oxygen gas and hydrogen gas. The heat treatment is performed by, for example, ISSG oxidation.

The heat treatment is performed, for example, in a non-oxidizing atmosphere. The heat treatment is performed, for example, in an atmosphere containing argon (Ar). The heat treatment is performed, for example, in an atmosphere containing nitrogen (N). The heat treatment is performed, for example, in an atmosphere containing argon gas. The heat treatment is performed, for example, in an atmosphere containing nitrogen gas.

The aluminum oxide film 78 finally becomes the first block insulating layer 18.

Figure 15:
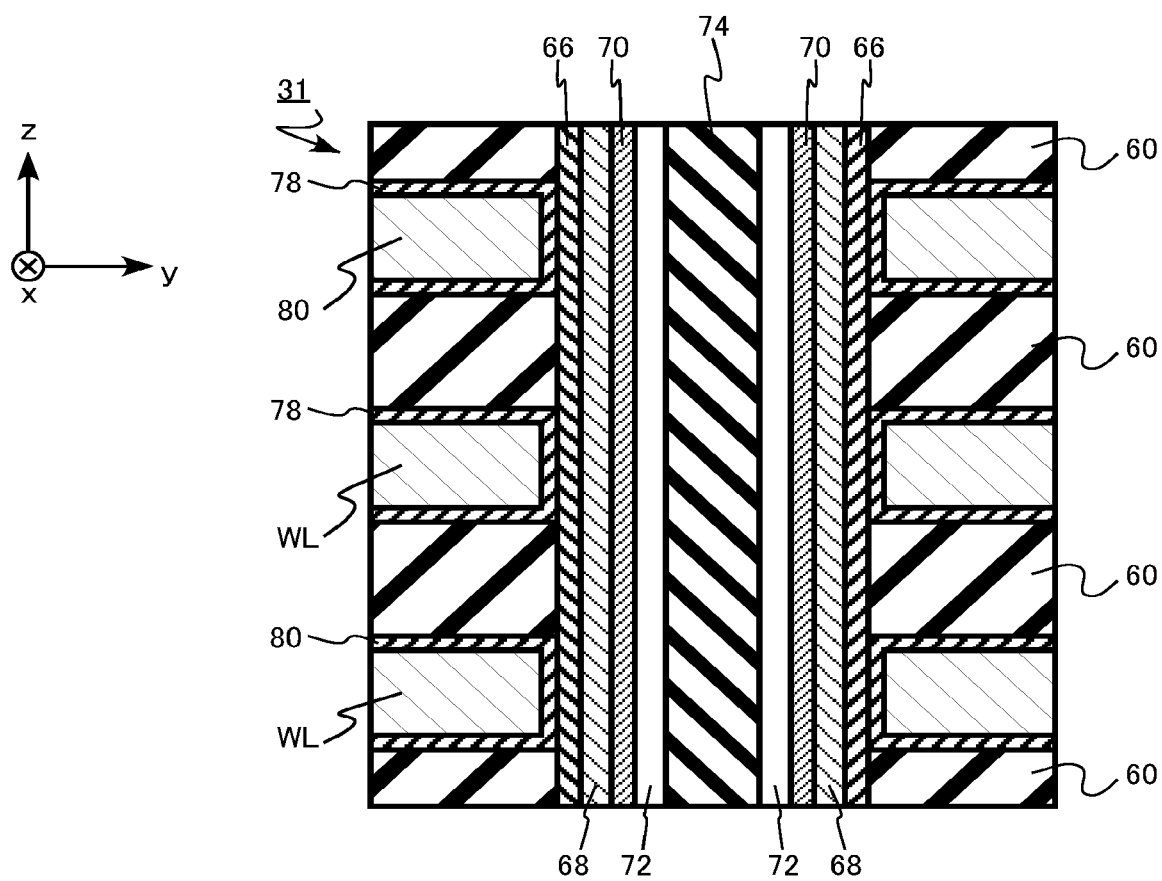
FIG. 15 is a schematic cross-sectional view showing an example of the semiconductor memory device manufacturing method according to the second embodiment.

Then, a tungsten film 80 is formed on the aluminum oxide film 78 (FIG. 15). The tungsten film 80 is an example of a conductive film. The tungsten film 80 is formed by using, for example, a CVD method.

The tungsten film 80 finally becomes the word line WL. Before forming the tungsten film 80, it is also possible to form a barrier metal film, such as a titanium nitride film.

By the manufacturing method described above, the memory cell array 200 of the semiconductor memory device according to the second embodiment shown in FIGS. 5A and 5B is manufactured.

Next, the function and effect of the semiconductor memory device according to the second embodiment will be described.

A three-dimensional NAND flash memory in which memory cells are three-dimensionally arranged realizes a high degree of integration and a low cost. In the three-dimensional NAND flash memory, for example, a memory hole penetrating a stacked body is formed in the stacked body in which a plurality of insulating layers and a plurality of gate electrode layers are alternately stacked. By forming a charge storage layer and a semiconductor layer in the memory hole, a memory string in which a plurality of memory cells are connected in series to each other is formed. Each memory cell has a block insulating layer for suppressing the charge held in the charge storage layer from escaping to the gate electrode. For the scaling-down of memory cells, a block insulating layer that is thin and has a small leakage current is required.

In addition, it is desirable that the block insulating layer of the three-dimensional NAND flash memory can be formed by a low temperature process. Since the block insulating layer can be formed at a low temperature, for example, it is possible to suppress a situation in which the structure formed before the formation of the block insulating layer is damaged by heat to degrade the characteristics of the three-dimensional NAND flash memory.

The memory cell array 200 of the three-dimensional NAND flash memory according to the second embodiment includes the first block insulating layer 18. The thickness of the first block insulating layer 18 is as small as 5 nm or less.

Since the first block insulating layer 18 is thin, the scaling-down of memory cells is promoted. Since the first block insulating layer 18 is thin, it is possible to reduce the size of the memory cell in each of the z direction, the x direction, and the y direction, for example. Therefore, for example, it becomes easy to increase the capacity of the three-dimensional NAND flash memory by increasing the number of memory cells of the three-dimensional NAND flash memory.

The aluminum oxide contained in the first block insulating layer 18 contains α-type aluminum oxide. Since the aluminum oxide contained in the first block insulating layer 18 contains α-type aluminum oxide, the leakage current of the first block insulating layer 18 is reduced.

The α-type aluminum oxide (α-alumina) has a smaller leakage current than other crystal phases such as γ-type aluminum oxide (γ-alumina) and θ-type aluminum oxide (θ-alumina). It is considered that the leakage current is reduced because the α-type aluminum oxide has a large bandgap and a low defect density in the film as compared with other crystal phases.

The aluminum oxide contained in the first block insulating layer 18 preferably contains α-type aluminum oxide as a main component. Since the aluminum oxide contained in the first block insulating layer 18 contains α-type aluminum oxide as a main component, the leakage current of the gate insulating layer 12 is reduced.

The first block insulating layer 18 preferably contains diaspore-type aluminum hydroxide. For example, by adjusting the heat treatment time when forming the aluminum oxide film 78 from the aluminum hydroxide film 77, the diaspore-type aluminum hydroxide can remain in the aluminum oxide film 78.

For example, when data is repeatedly written to and read from the memory cell, the electric field stress applied to the first block insulating layer 18 may cause a defect in the first block insulating layer 18, resulting in an increase in the leakage current. The defect is, for example, a dangling bond.

Since the first block insulating layer 18 contains diaspore-type aluminum hydroxide, hydrogen (H) contained in the aluminum hydroxide terminates a dangling bond generated in the first block insulating layer 18. Therefore, the increase in the leakage current of the first block insulating layer 18 is suppressed, so that the reliability of the three-dimensional NAND flash memory is improved.

The first block insulating layer 18 preferably contains sulfur (S) or chlorine (Cl). The sulfur (S) or chlorine (Cl) contained in the first block insulating layer 18 is derived from, for example, sulfuric acid or hydrochloric acid contained in the fluid when the first block insulating layer 18 is formed.

The first block insulating layer 18 preferably contains nitrogen (N). The nitrogen (N) contained in the first block insulating layer 18 is derived from, for example, nitric acid or ammonia contained in the fluid when the first block insulating layer 18 is formed.

By the manufacturing method according to the second embodiment, the first block insulating layer 18 according to the second embodiment is formed. In the manufacturing method according to the second embodiment, the aluminum hydroxide film 77 containing diaspore-type aluminum hydroxide is formed from the aluminum nitride film 76 by treatment in a fluid containing water. Then, the aluminum oxide film 78 is formed from the aluminum hydroxide film 77. According to the manufacturing method, by the same function as in the manufacturing method according to the first embodiment, the aluminum oxide film 78 containing α-type aluminum oxide can be formed by heat treatment at a low temperature that is equal to or less than 800° C.

Therefore, the first block insulating layer 18 can be formed by the low temperature process. As a result, for example, it is possible to suppress a situation in which the structure formed before the formation of the block insulating layer is damaged by heat to degrade the characteristics of the three-dimensional NAND flash memory.

As described above, according to the second embodiment, it is possible to provide a semiconductor device including an insulating layer having a small leakage current. In addition, according to the second embodiment, it is possible to provide a method for manufacturing a semiconductor device including an insulating layer having a small leakage current.

In the second embodiment, the case where the interlayer insulating layer 13 is provided between the word lines WL has been described as an example. However, there may be a cavity between the word lines WL, for example.

In the second embodiment, the structure in which the semiconductor layer 10 is surrounded by the word line WL has been described as an example. However, it is also possible to have a structure in which the semiconductor layer 10 is interposed between the two divided word lines WL. In the case of this structure, the number of memory cells in the stacked body 30 can be doubled.

In addition, in the second embodiment, the structure in which one semiconductor layer 10 is provided in one memory hole has been described as an example. However, it is also possible to have a structure in which a plurality of semiconductor layers 10, which are two or more divided semiconductor layers, are provided in one memory hole. In the case of this structure, the number of memory cells in the stacked body 30 can be doubled or more.

In addition, in the second embodiment, the case where the charge storage layer is an insulating layer has been described as an example. However, the charge storage layer may be a conductive layer, for example, a plurality of floating conductive layers electrically separated from each other.

While certain embodiments have been described, these embodiments have been presented by way of example only, and are not intended to limit the scope of the inventions. Indeed, the semiconductor device manufacturing method, the semiconductor memory device manufacturing method, the semiconductor memory device, and the substrate treatment apparatus described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device manufacturing method, comprising:
    forming an aluminum nitride film;
    forming an aluminum hydroxide film containing diaspore-type aluminum hydroxide by performing treatment in a fluid containing water to the aluminum nitride film; and
    forming an aluminum oxide film containing α-type aluminum oxide by performing heat treatment to the aluminum hydroxide film at a temperature equal to or more than 500° C. and equal to or less than 800° C.

2. The semiconductor device manufacturing method according to claim 1,
    wherein the treatment is performed at a temperature equal to or more than 250° C. and equal to or less than 400° C. and a pressure equal to or more than 15 MPa and equal to or less than 100 MPa.

3. The semiconductor device manufacturing method according to claim 1,
    wherein a thickness of the aluminum nitride film is equal to or more than 0.5 nm and equal to or less than 5 nm.

4. The semiconductor device manufacturing method according to claim 1,
    wherein the heat treatment is performed in an atmosphere containing oxygen.

5. The semiconductor device manufacturing method according to claim 1,
    wherein the fluid is acidic or alkaline.

6. The semiconductor device manufacturing method according to claim 1,
    wherein the fluid contains nitric acid, sulfuric acid, hydrochloric acid, or ammonia.

7. The semiconductor device manufacturing method according to claim 1,
    wherein, during the treatment, a temperature is set to be equal to or more than 250° C. and a pressure is set to be equal to or more than 15 MPa within 30 minutes after the aluminum nitride film comes into contact with the fluid.

8. The semiconductor device manufacturing method according to claim 1,
    wherein a pressure of the heat treatment is equal to or less than atmospheric pressure.

9. The semiconductor device manufacturing method according to claim 1,
    wherein the fluid is a supercritical fluid or a subcritical fluid.

10. A semiconductor memory device manufacturing method, comprising:
    forming a stacked structure including an oxide layer and a nitride layer alternately stacked in a first direction;
    forming a hole extending in the first direction in the stacked structure;
    forming a charge storage layer inside the hole;
    forming a first insulating film inside the hole;
    forming a semiconductor layer inside the hole;
    removing the nitride layer selectively with respect to the oxide layer;
    forming an aluminum nitride film in a region where the nitride layer has been removed;
    forming an aluminum hydroxide film containing diaspore-type aluminum hydroxide by performing treatment in a fluid containing water to the aluminum nitride film;
    forming an aluminum oxide film containing α-type aluminum oxide by performing heat treatment to the aluminum hydroxide film at a temperature equal to or more than 500° C. and equal to or less than 800° C.; and
    forming a conductive film in the region.

11. The semiconductor memory device manufacturing method according to claim 10, further comprising:
    forming a second insulating film inside the hole before the forming the charge storage layer.

12. The semiconductor memory device manufacturing method according to claim 11,
    wherein the second insulating film is exposed when the nitride layer is removed.

13. The semiconductor memory device manufacturing method according to claim 10,
    wherein the treatment is performed at a temperature equal to or more than 250° C. and equal to or less than 400° C. and a pressure equal to or more than 15 MPa and equal to or less than 100 MPa.

14. The semiconductor memory device manufacturing method according to claim 10,
    wherein a thickness of the aluminum nitride film is equal to or more than 0.5 nm and equal to or less than 5 nm.

15. The semiconductor memory device manufacturing method according to claim 10,
    wherein the heat treatment is performed in an atmosphere containing oxygen.

16. The semiconductor memory device manufacturing method according to claim 10,
    wherein the fluid is acidic or alkaline.

17. The semiconductor memory device manufacturing method according to claim 10,
    wherein the fluid contains nitric acid, sulfuric acid, hydrochloric acid, or ammonia.

18. The semiconductor memory device manufacturing method according to claim 10,
    wherein, during the treatment, a temperature is set to be equal to or more than 250° C. and a pressure is set to be equal to or more than 15 MPa within 30 minutes after the aluminum nitride film comes into contact with the fluid.

19. The semiconductor memory device manufacturing method according to claim 10,
    wherein a pressure of the heat treatment is equal to or less than atmospheric pressure.

20. The semiconductor memory device manufacturing method according to claim 10,
    wherein the fluid is a supercritical fluid or a subcritical fluid.

* * * * *